(12) United States Patent
Chyi Liu et al.

(10) Patent No.: US 11,640,971 B2
(45) Date of Patent: May 2, 2023

(54) DEEP TRENCH CAPACITOR INCLUDING SELF-ALIGNED PLATE CONTACT VIA STRUCTURES AND METHODS OF FORMING THE SAME

(71) Applicant: Taiwan Semiconductor Manufacturing Company Limited, Hsinchu (TW)

(72) Inventors: Ming Chyi Liu, Hsinchu (TW); Yu-Hsing Chang, Taipei (TW); Shih-Chang Liu, Alian Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 117 days.

(21) Appl. No.: 17/126,294

(22) Filed: Dec. 18, 2020

(65) Prior Publication Data

US 2022/0199759 A1 Jun. 23, 2022

(51) Int. Cl.
*H01L 49/02* (2006.01)
*H01L 21/311* (2006.01)
*H01L 21/768* (2006.01)

(52) U.S. Cl.
CPC ........ *H01L 28/75* (2013.01); *H01L 21/31111* (2013.01); *H01L 21/76802* (2013.01); *H01L 21/76877* (2013.01)

(58) Field of Classification Search
CPC ............... H01L 28/75; H01L 28/86–88; H01L 28/91–92; H01L 21/76877; H01L 21/76897
See application file for complete search history.

(56) References Cited

U.S. PATENT DOCUMENTS 9,178,080 B2 * 11/2015 Kalnitsky ............. H01L 29/945
9,209,189 B2 * 12/2015 Sakamoto ......... H01L 27/10808
(Continued)

FOREIGN PATENT DOCUMENTS

| TW | 202013442 A | 4/2020 |
| TW | I700837 | 8/2020 |
| WO | 2020186460 A1 | 9/2020 |

OTHER PUBLICATIONS

Taiwan Patent and Trademark Office, Application No. 110108842, Office Action dated Jul. 7, 2021, 7 pages.

*Primary Examiner* — Bac H Au
(74) *Attorney, Agent, or Firm* — The Marbury Law Group, PLLC

(57) ABSTRACT

A deep trench is formed in a substrate, and a layer stack including at least three metallic electrode plates interlaced with at least two node dielectric layers is formed in, and over, the deep trench. A contact-level dielectric material layer over the layer stack, and contact via cavities are formed therethrough. The depths of the contact via cavities are differentiated by selectively increasing the depth of a respective subset of the contact via cavities by performing at least twice a combination of processing steps that includes an etch mask formation process and an etch process. A combination of a dielectric contact via liner and a plate contact via structure can be formed within each of the contact via cavities. Plate contact via structures that extend through any metallic electrode plate can be electrically isolated from such a metallic electrode plate by a respective dielectric contact via liner.

20 Claims, 22 Drawing Sheets

(56) References Cited

U.S. PATENT DOCUMENTS

| | | | |
|---|---|---|---|
| 9,722,015 B1* | 8/2017 | Kalnitsky | H01L 21/76232 |
| 9,978,829 B2* | 5/2018 | Lin | H01L 29/945 |
| 10,164,005 B2* | 12/2018 | Tsui | H01L 28/90 |
| 2012/0061798 A1* | 3/2012 | Wong | H01L 27/10867 |
| | | | 257/532 |
| 2015/0145103 A1* | 5/2015 | Chou | H01L 21/822 |
| | | | 438/387 |
| 2015/0348964 A1 | 12/2015 | Chou et al. | |
| 2018/0076276 A1* | 3/2018 | Chou | H01L 28/87 |
| 2020/0176552 A1* | 6/2020 | Chang | H01L 23/5329 |

* cited by examiner

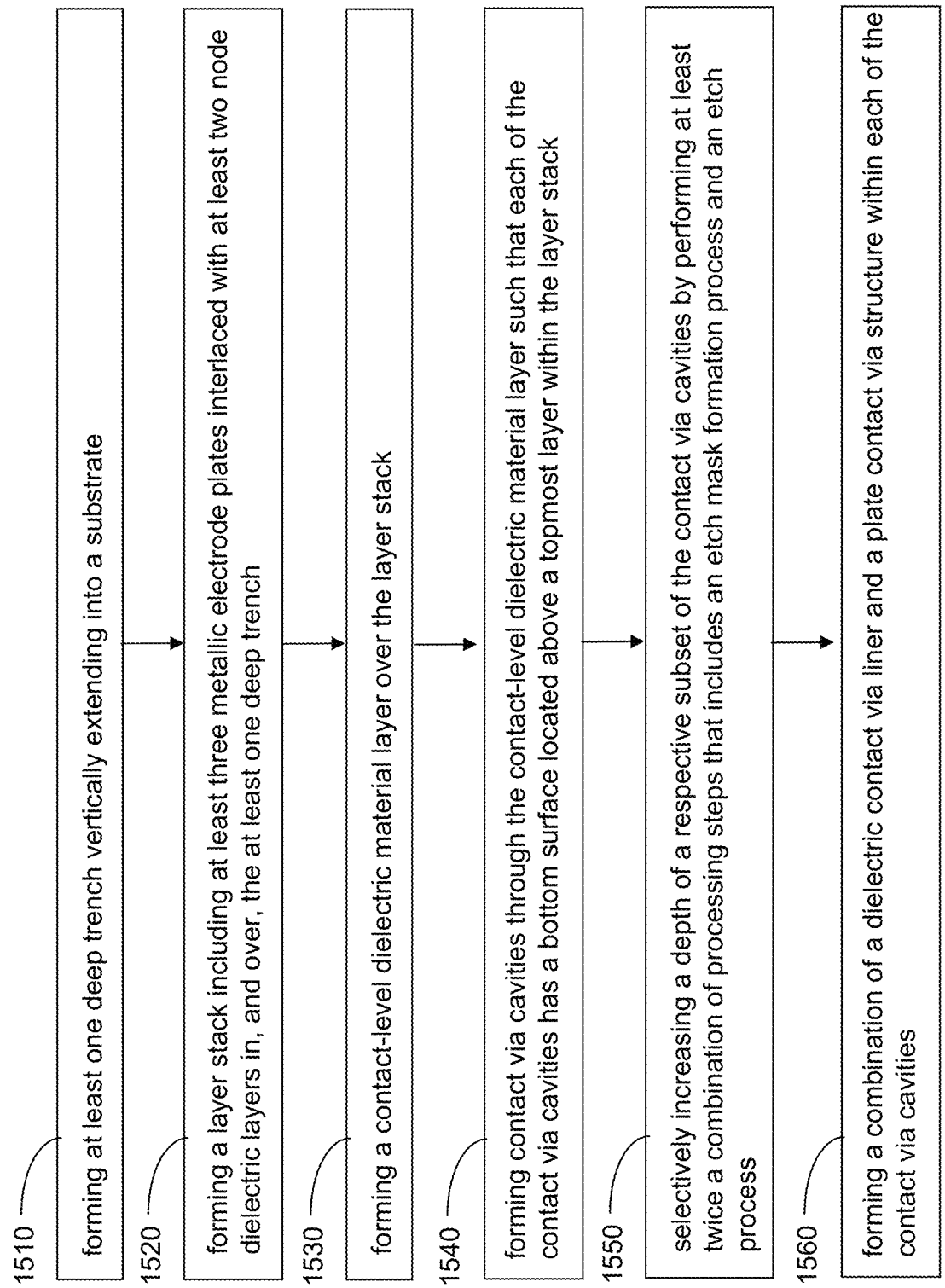

DEEP TRENCH CAPACITOR INCLUDING SELF-ALIGNED PLATE CONTACT VIA STRUCTURES AND METHODS OF FORMING THE SAME

BACKGROUND

Capacitors are employed in semiconductor chips for many applications such as power supply stabilization. Capacitors tend to take up a significant amount of device area, and thus, capacitors that can provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is a flowchart that illustrates the general processing steps of the methods of the present disclosure.

DETAILED DESCRIPTION

Figure 1:
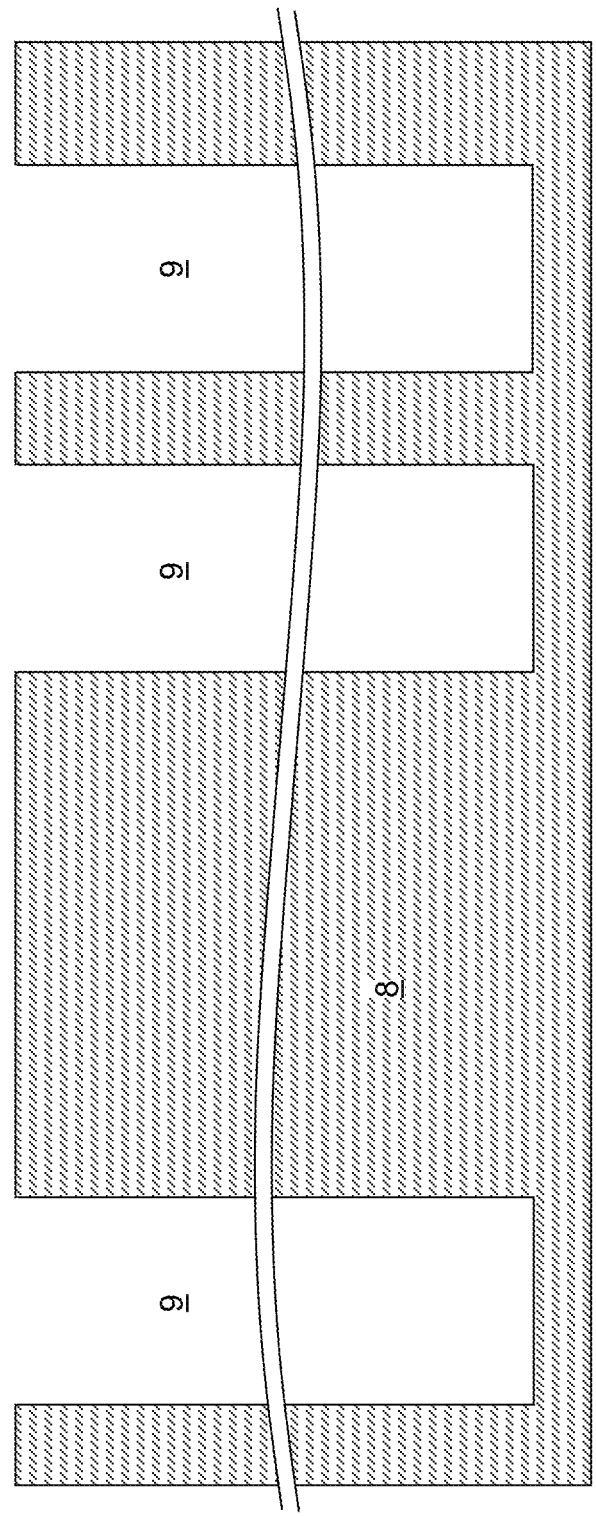
FIG. 1 is a vertical cross-sectional view of an exemplary structure after formation of deep trenches into a substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a deep trench capacitor including self-aligned plate contact via structures and methods of forming the same.

Deep trench capacitors may be used as an integrated passive device to provide large capacitance, which can be used to stabilize a power supply and function as a noise filter in handheld devices. If more than two electrode plates are used in a deep trench capacitor, the process window for a contact etch process can be very narrow. The contact etch process can simultaneously etch through different types of layer stacks to provide contact via cavities to each of the electrode plates of a deep trench capacitor. However, electrical shorts to underlying electrode plate may occur for some electrode plates that are not provided with sufficient overlying etch stop material portions, and/or electrical opens may occur for some other electrode plates that are provided with too thick overlying etch stop material portions. Because horizontal portions of the electrode plates are located at different heights, providing etch stop structures with an optimal thickness for each type of electrode plates can be a challenging process, and is prone to yield degradation under process variations.

Generally, the structures and methods of the present disclosure may be used to form a deep trench capacitor having reliable electrical contact structures with reduced electrical opens and electrical shorts. Process windows for forming electrical contacts to metallic electrode plates without electrical opens or electrical shorts can be widened using a process integrated scheme according to embodiments the present disclosure.

Specifically, an interlaced layer stack of metallic electrode plates and node dielectric layers may be formed in the deep trenches. The interlaced layer stack of metallic electrode plates may be subsequently patterned using a single etch mask that defines the periphery of a patterned layer stack. A contact-level dielectric layer may be formed over the patterned layer stack. Vertical via cavities may be formed through the contact-level dielectric layer over horizontal portions of the patterned layer stack. The vertical via cavities may be selectively extended in the vertical direction by different vertical extension distance using combinations of masking steps and selective etch processes. A combination of selective etch steps may be used in each selective etch process to sequentially etch through a node dielectric layer selective to the material of metallic electrode plates and then to etch through a metallic electrode plate selective to the material of the node dielectric layers. The selectivity of the selective etch steps may be high enough to accommodate process variations in the processes used to form the interlaced layer stack. Horizontal portions of the metallic electrode plates located at different levels may be physically exposed at the bottom of the vertically extended contact via cavities having different depths. Plate contact via structures that are laterally insulated with dielectric contact via liners may be formed in the contact via cavities to provide electrical contact to the metallic electrode plates. The dielectric contact via liners may provide electrical isolation between an embedded plate contact via structure and any horizontal portion of the metallic electrode plates that overlie the metallic electrode plate in contact with the embedded plate contact via structure. Reliable electrical contact between the plate contact via structures and the metallic electrode plates may provide higher yield and increased durability of the deep trench capacitor according to embodiments of the present disclosure.

Referring to FIG. 1, an exemplary structure according to an embodiment of the present disclosure is illustrated, which comprises a substrate 8 having a planar top surface. The substrate 8 may include a semiconductor material, and may have a thickness of at least 10 microns. In one embodiment, the substrate 8 may include a commercially available semiconductor wafer that may be diced into semiconductor dies after formation of deep trenches. For example, the substrate 8 may include a semiconductor substrate including single crystalline silicon and having a thickness in a range from 500 microns to 1,500 microns.

Deep trenches 9 vertically extending into the substrate 8 may be formed by forming a patterned etch mask layer on the front side surface of the substrate 8. The pattern in the patterned etch mask layer may be transferred the into an upper portion of the substrate 8. An optional pad dielectric layer such as a silicon oxide pad layer may be formed on the front side surface, i.e., the top surface, of the substrate 8 prior to formation of the patterned etch mask layer. In an exemplary embodiment, the pad dielectric layer may include a silicon oxide layer having a thickness in a range from 20 nm to 100 nm. The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer, forming a lithographically patterned photoresist layer over the blanket etch mask layer, and by transferring the pattern in the lithographically patterned photoresist layer through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including HBr, $NF_3$, $O_2$, and $SF_6$ may be used to form the deep trenches 9. The depth of the deep trenches 9 may be in a range from 1 micron to 10 microns. The horizontal cross-sectional shape of each deep trench 9 may have a shape of a circle, an ellipse, a rectangle, a rounded rectangle, an annulus having an inner periphery and an outer periphery of various shapes, or of any two-dimensional shape that defines an enclosed volume. An array of deep trenches 9 of a same horizontal cross-sectional shape or of different horizontal cross-sectional shapes may be formed within each device region for forming a deep trench capacitor, which is herein referred to as a unit capacitor region. A plurality of unit capacitor regions may be provided in the substrate 8.

The deep trenches 9 may have a respective uniform width (as in the case of a circle or a rectangle) or a variable width (for example, in case facing sidewalls have lateral undulations). Generally, a predominant portion (such as more than 50% of the entire area) of each deep trench 9 may have a width that is sufficient to accommodate vertically-extending portions of all metallic electrode plates and at least two node dielectric layers to be subsequently formed. For example, a predominant portion of each deep trench 9 may have a width that is sufficient to accommodate vertically-extending portions of at least three metallic electrode plates and at least two node dielectric layers. In an illustrative example, a predominant portion of each deep trench 9 may have a width that is in a range from 50 nm to 1,000 nm, although lesser and greater widths can also be used.

The photoresist layer may be removed prior to the anisotropic etch process that forms the deep trenches 9, or may be consumed during the anisotropic etch process that forms the deep trenches 9. The patterned etch mask layer and the optional dielectric pad layer can be subsequently removed, for example, by a respective isotropic etch process such as a wet etch process.

Figure 2:
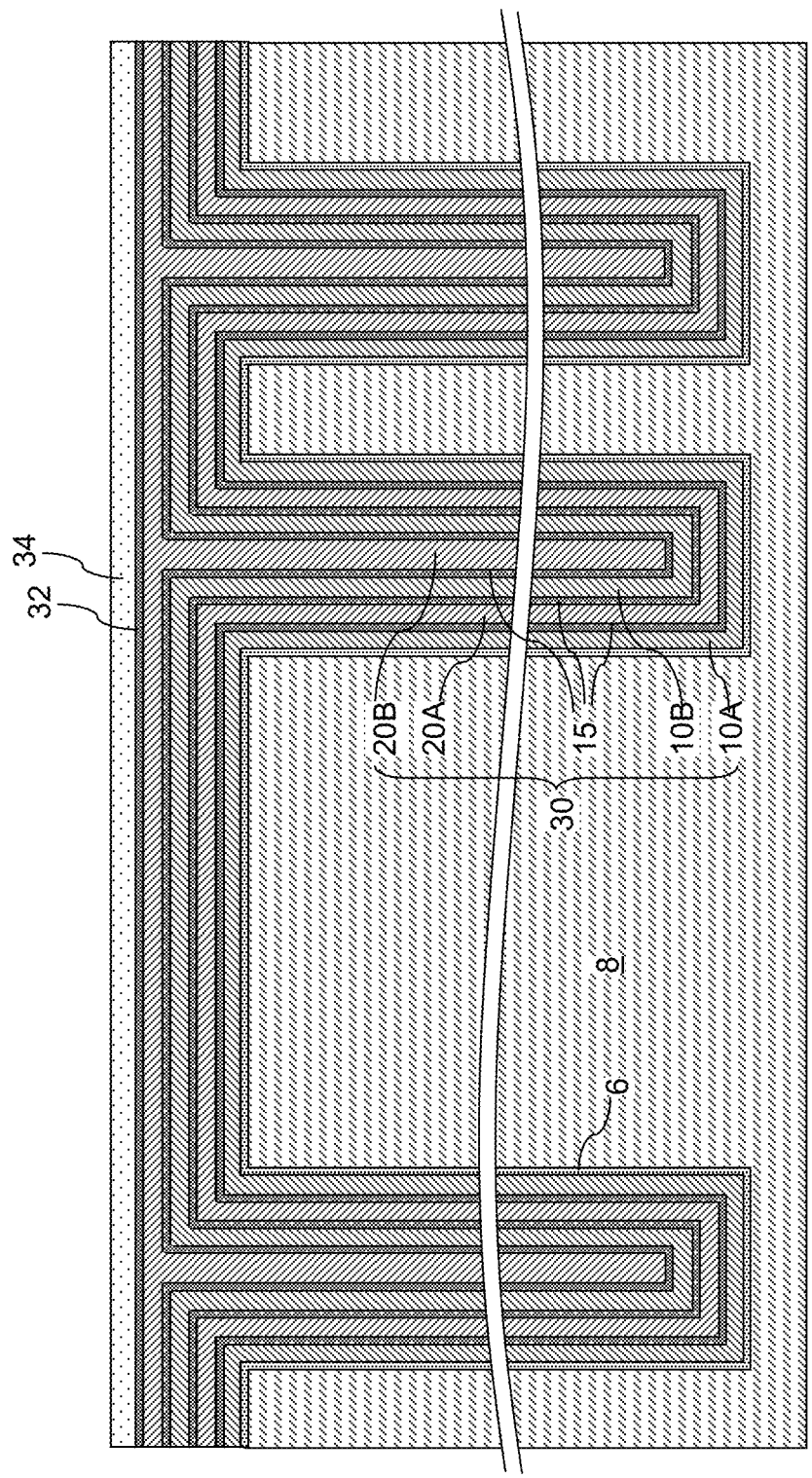
FIG. 2 is a vertical cross-sectional view of the exemplary structure after formation of a layer stack including at least three metallic electrode plates interlaced with at least two node dielectric layers according to an embodiment of the present disclosure.

Referring to FIG. 2, a dielectric isolation layer 6 may be formed on the physically exposed surface of the semiconductor substrate 8 including the exposed surface of the of the semiconductor substrate 8 in each of the deep trenches 9. The dielectric isolation layer 6 may include a dielectric material that provides electrical isolation between the deep trench capacitors to be subsequently formed and the substrate 6. For example, the dielectric isolation layer 6 can include silicon oxide, silicon nitride, silicon oxynitride, and/or a dielectric metal oxide. Other suitable materials within the contemplated scope of disclosure may also be used. In an illustrative example, the dielectric isolation layer 6 may include a silicon oxide layer formed by thermal oxidation of surface portions of the substrate 8 that includes silicon. The thickness of the dielectric isolation layer 6 may be in a range from 4 nm to 100 nm, although lesser and greater thicknesses can also be used.

An alternating layer stack 30 of metallic electrode plates (10A, 20A, 10B, 20B) and node dielectric layers 15 may be formed by a respective conformal deposition process. Each of the metallic electrode plates (10A, 20A, 10B, 20B) may include a metallic material. In one embodiment, each metallic electrode plate (10A, 20A, 10B, 20B) comprises, and/or consists essentially of, a conductive metallic nitride material, which can be a metallic diffusion barrier material. For example, each metallic electrode plate (10A, 20A, 10B, 20B) can include, and/or can consist essentially of, a conductive metallic nitride material such as TiN, TaN, or WN. Other suitable materials within the contemplated scope of disclosure may also be used. Use of a metallic diffusion barrier material for the metallic electrode plates (10A, 20A, 10B, 20B) may be advantageous because diffusion of metallic elements through the node dielectric layers 15 and/or through the dielectric isolation layer 6 may cause deleterious effects for deep trench capacitors. Each metallic electrode plate (10A, 20A, 10B, 20B) may be formed by a conformal deposition process such as chemical vapor deposition (CVD) or atomic layer deposition (ALD). The thickness of each metallic electrode plate (10A, 20A, 10B, 20B) may be in a range from 5 nm to 50 nm, although lesser and greater thicknesses can also be used. In one embodiment, each metallic electrode plate (10A, 20A, 10B, 20B) may have the same material composition and the same thickness. In another embodiment, each metallic electrode plate (10A, 20A, 10B, 20B) may have the same material composition but have varying thicknesses. In yet another embodiment, each metallic electrode plate (10A, 20A, 10B, 20B) may have different material composition and the same thickness. In yet another embodiment, each metallic electrode plate (10A, 20A, 10B, 20B) may have different material composition and different thicknesses.

Each of node dielectric layers 15 may include a node dielectric material, which can be a dielectric metal oxide material having a dielectric constant greater than 7.9 (which is the dielectric constant of silicon nitride), i.e., a "high-k" dielectric metal oxide material. For example, the node dielectric layer 15 can include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 can include amorphous aluminum oxide layer that can be subsequently annealed into polycrystalline aluminum oxide material after formation of contact via cavities, such as after formation of plate contact via structures. Other suitable materials within the contemplated scope of disclosure may also be used. Each node dielectric layer 15 may be formed by a conformal deposition process such as chemical vapor deposition (CVD) or atomic layer deposition (ALD). The thickness of each node dielectric layer 15 may be in a range from 1 nm to 20 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses.

The total number of the metallic electrode plates (10A, 20A, 10B, 20B) may be in a range from 3 to 16, such as from 4 to 8. The total number of the node dielectric layers 15 may be one less than the total number of the metallic electrode plates (10A, 20A, 10B, 20B). While the present disclosure is described using an embodiment in which the alternating layer stack 30 of the metallic electrode plates (10A, 20A, 10B, 20B) and the node dielectric layers 15 include four metallic electrode plates (10A, 20A, 10B, 20B) and three node dielectric layers 15, embodiments are expressly contemplated herein in which different numbers of metallic electrode plates (10A, 20A, 10B, 20B) and different numbers of node dielectric layers 15 may be used within the alternating layer stack 30. Generally, an alternating layer stack 30 may include at least three metallic electrode plates (10A, 20A, 10B, 20B) interlaced with at least two node dielectric layers 15 that may be formed in, and over, at least one deep trench 9 formed in a substrate 8.

The metallic electrode plates (10A, 20A, 10B, 20B) may be sequentially numbered in the order of deposition. For example, the metallic electrode plates (10A, 20A, 10B, 20B) may include a first metallic electrode plate 10A, a second metallic electrode plate 20A, a third metallic electrode plate 10B, a fourth metallic electrode plate 20B, etc. Patterned portions of each odd-numbered metallic electrode plate (10A, 10B) may be subsequently used to form a primary electrode assembly that functions as a primary node, i.e., a first node, of a deep trench capacitor, and patterned portions of each even-numbered metallic electrode plate (20A, 20B) may be subsequently used to form a complementary electrode assembly that functions as a complementary node, i.e., a second node, of the deep trench capacitor. The total number of the metallic electrode plates (10A, 20A, 10B, 20B), the thicknesses of the metallic electrode plates (10A, 20A, 10B, 20B), and the width of the deep trenches 9 may be selected such that a predominant portion (i.e., more than 50%), or all, areas of the deep trenches 9 may be filled with the alternating layer stack 30.

A node dielectric material layer 32 may be formed over the alternating layer stack 30. The thickness and the composition of the node dielectric material layer 32 can be the same as one, or each, of the node dielectric layers 15. An optional dielectric spacer layer 34 may be optionally deposited over the node dielectric material layer 32. The dielectric spacer layer 34 may fill any remaining void in the deep trenches 9, if such voids are present. In addition, the dielectric spacer layer 34 may provide a planar horizontal top surface. In an illustrative example, the dielectric spacer layer 34 may include silicon oxide, and can have a thickness in a range from 1 nm to 100 nm, although greater thicknesses can also be used. Other suitable materials within the contemplated scope of disclosure may also be used. In one embodiment, the dielectric spacer layer 34 may be formed by a conformal deposition process or a self-planarizing deposition process such as spin coating, for example, by application of a flowable oxide (FOX) material.

Figure 3:
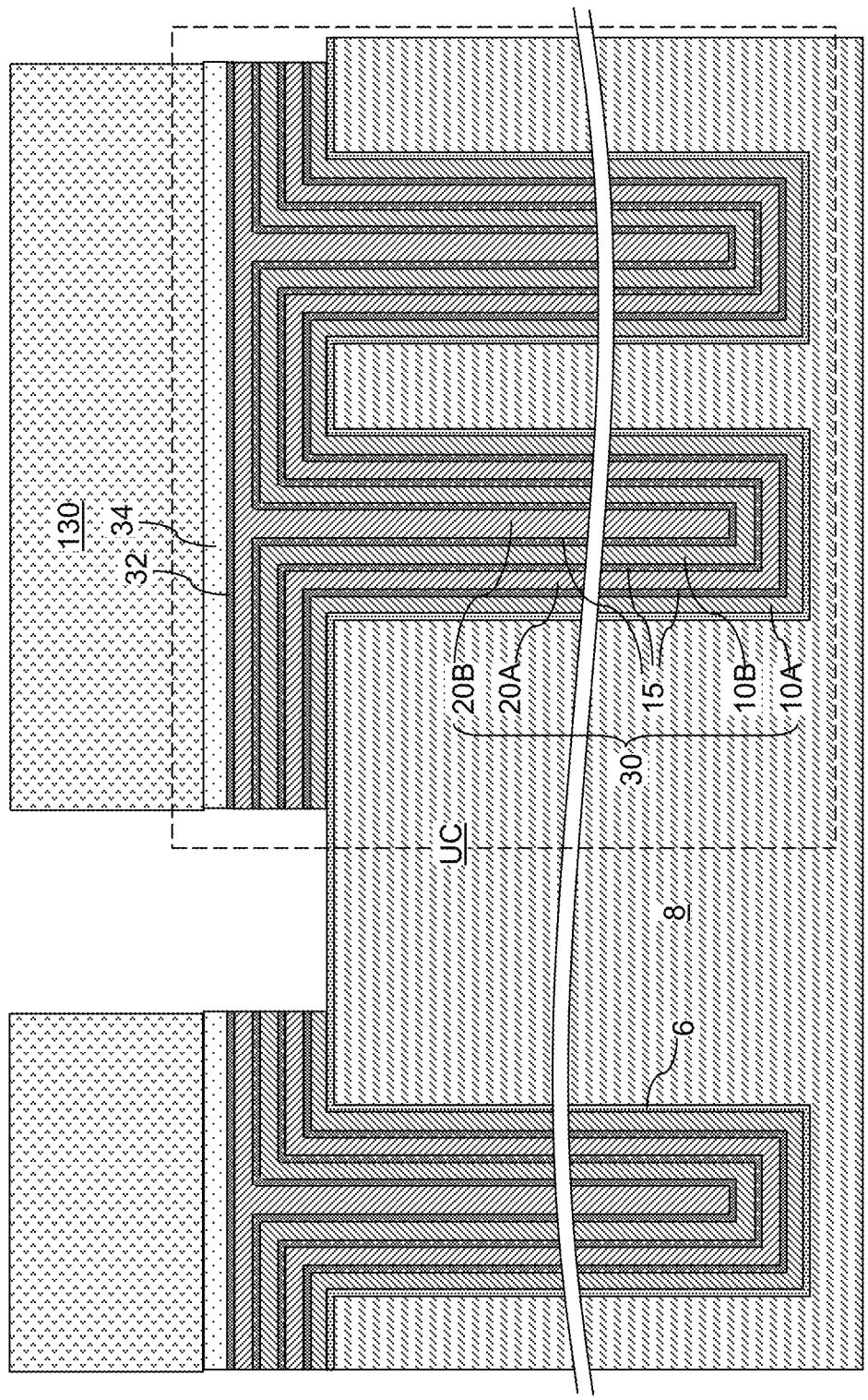
FIG. 3 is a vertical cross-sectional view of the exemplary structure after patterning the layer stack to form vertical sidewalls for horizontally-extending portions of the layer stack according to an embodiment of the present disclosure.

Referring to FIG. 3, a photoresist layer 130 may be applied over the optional dielectric spacer layer 34 and the node dielectric material layer 32. The photoresist layer 130 may be lithographically patterned to form an array of discrete patterned portions located within a respective device region, which is herein referred to as a unit capacitor region UC. A one-dimensional array of unit capacitor regions UC or a two-dimensional array of unit capacitor regions UC may be provided. Each unit capacitor region UC can have an area of any two-dimensional shape having a closed periphery such as a circle, an ellipse, a polygon, a polygon with rounded corners, or any generally curvilinear two-dimensional shape. In one embodiment, the pattern of the discrete portions of the photoresist layer 130 may be a periodic pattern.

An anisotropic etch process may be performed to etch through unmasked portions of the optional dielectric spacer layer 34, the node dielectric material layer 32, and the alternating layer stack 30 using the patterned photoresist layer 130 as an etch mask. Horizontally-extending portions of the optional dielectric spacer layer 34, the node dielectric material layer 32, and each layer within the alternating layer stack 30 may be divided into a plurality of discrete patterned portions located within a respective unit capacitor region UC. In embodiments in which the pattern of the discrete portions of the photoresist layer 130 includes a periodic pattern, the patterned portions of the optional dielectric spacer layer 34, the node dielectric material layer 32, and the alternating layer stack 30 can be arranged as a one-dimensional or two-dimensional array of unit structures. Each unit structure can be located within a respective unit capacitor region UC.

Each unit capacitor region UC includes at least one deep trench 9. An alternating layer stack 30 of metallic electrode plates (10A, 20A, 10B, 20B) and node dielectric layers 15 may be provided within each unit capacitor region UC. In an embodiment, the alternating layer stack 30 may include at least three metallic electrode plates (10A, 20A, 10B, 20B) interlaced with at least two node dielectric layers 15. Each layer (10A, 20A, 10B, 20B, 15) within the alternating layer stack 30 may comprises a respective vertically-extending portion located inside each of the at least one deep trench 9 and a respective horizontally-extending portion located above the top surface of the substrate 8.

The sidewalls 17 of horizontally-extending portions of the layers within the alternating layer stack 30 may be vertical, and be coincident with the sidewalls of the patterned portions of the photoresist layer 130. Thus, each outer sidewall 17 of the horizontally-extending portion of each layer within the alternating layer stack 30 can be located within a respective vertical plane. The set of all sidewalls 17 of the horizontally-extending portion of all layers within the alternating layer stack 30 can be located within a plurality of N vertical planes, for example, in case the horizontally-extending portion of all layers within the alternating layer stack 30 have a horizontal cross-sectional shape of a polygon (such as a rectangle) with N sides. Alternatively, the set of all sidewalls 17 of the horizontally-extending portion of all layers within the alternating layer stack 30 can be located with a single vertical planes having a curvature in a horizontal plane, for example, in case the horizontally-extending portion of all layers within the alternating layer stack 30 have a circular shape, an elliptical shape, or a two-dimensional shape that consists of a single curved periphery. Generally, each outer sidewall of the horizontally-extending portion of each layer within the alternating layer stack 30 can be located within a respective vertical plane within a set of at least one vertical plane that contains an entirety of the outer periphery of the alternating layer stack 30. The patterned photoresist layer 30 can be subsequently removed, for example, by ashing.

Figure 4:
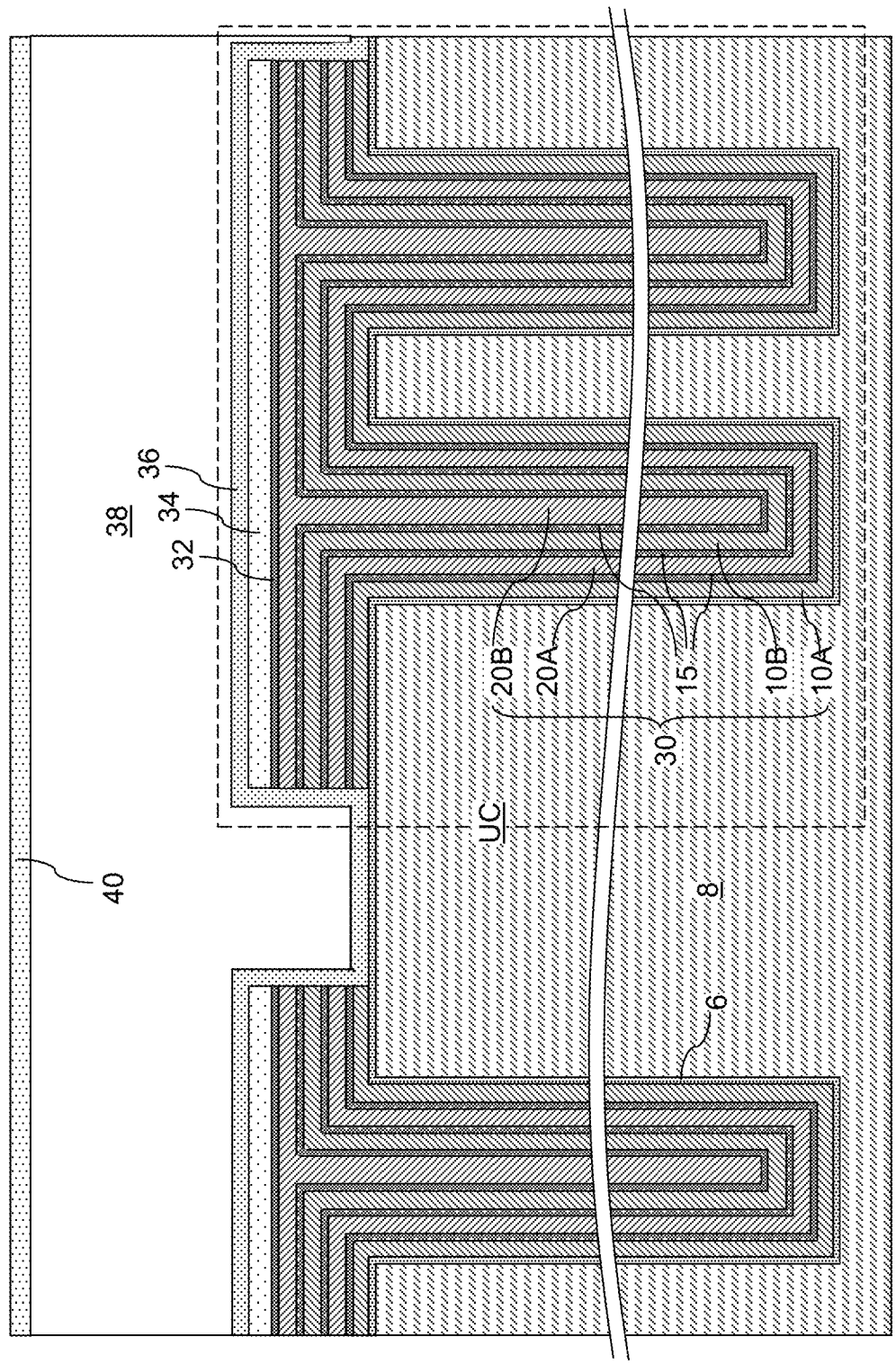
FIG. 4 is a vertical cross-sectional view of the exemplary structure after formation of a contact-level dielectric layer according to an embodiment of the present disclosure.

Referring to FIG. 4, an etch stop dielectric layer 36 may be formed over each patterned structure including a respective alternating layer stack 30, a node dielectric material layer 32, and an optional dielectric spacer layer 34. A contact-level dielectric layer 38 may be deposited over the etch stop dielectric layer 36. The etch stop dielectric layer 36 may include a material that provides etch resistance to the etch chemistry used in a subsequently anisotropic etch process to be used to form contact via cavities through the contact-level dielectric layer 38. For example, the etch stop dielectric layer 36 may include silicon nitride, and the contact-level dielectric layer 38 can include silicon oxide. Other suitable materials within the contemplated scope of disclosure may also be used. Horizontal portions of the etch stop dielectric layer 36 may have a uniform thickness, which can be in a range from 10 nm to 100 nm, although lesser and greater thicknesses can also be used.

The top surface of the contact-level dielectric layer 38 may be planarized by forming the contact-level dielectric layer 38 using a self-planarizing process (such as spin coating), or by chemical mechanical planarization. The thickness of the portion of the contact-level dielectric layer 38 overlying an alternating layer stack 30 may be in a range from 100 nm to 1,000 nm, although lesser and greater thicknesses can also be used.

The etch stop dielectric layer 36 overlies each alternating layer stack 30. Each horizontally-extending portion of each layer (i.e., 10A, 10B, 20A, 20B, 15) within an alternating layer stack 30 may have vertical sidewalls that are vertically coincident with respect to one another, i.e., located within a same vertical plane. The entire periphery of a horizontal bottom surface of the etch stop dielectric layer 36 that overlies an alternating layer stack 30 within a unit capacitor region UC can adjoin the entire upper periphery of a vertically-extending portion of the etch stop dielectric layer 36. The vertically-extending portion of the etch stop dielectric layer 36 may laterally surround, and can contact, each outer sidewall of each layer within the alternating layer stack 30 that underlies the horizontal bottom surface of the etch stop dielectric layer 36. In one embodiment, all interfaces between the vertically-extending portion of the etch stop dielectric layer 36 and the outer sidewalls of each layer within alternating layer stack 30 may be vertical.

A dielectric capping layer 40 may be formed over the top surface of the contact-level dielectric layer 38. The dielectric capping layer 40 may include a different dielectric material than the dielectric material of the contact-level dielectric layer 38. For example, the dielectric capping layer 40 can include silicon oxynitride having a thickness in a range from 10 nm to 100 nm, although different materials and different thicknesses may also be used for the dielectric capping layer 40.

Figure 5:
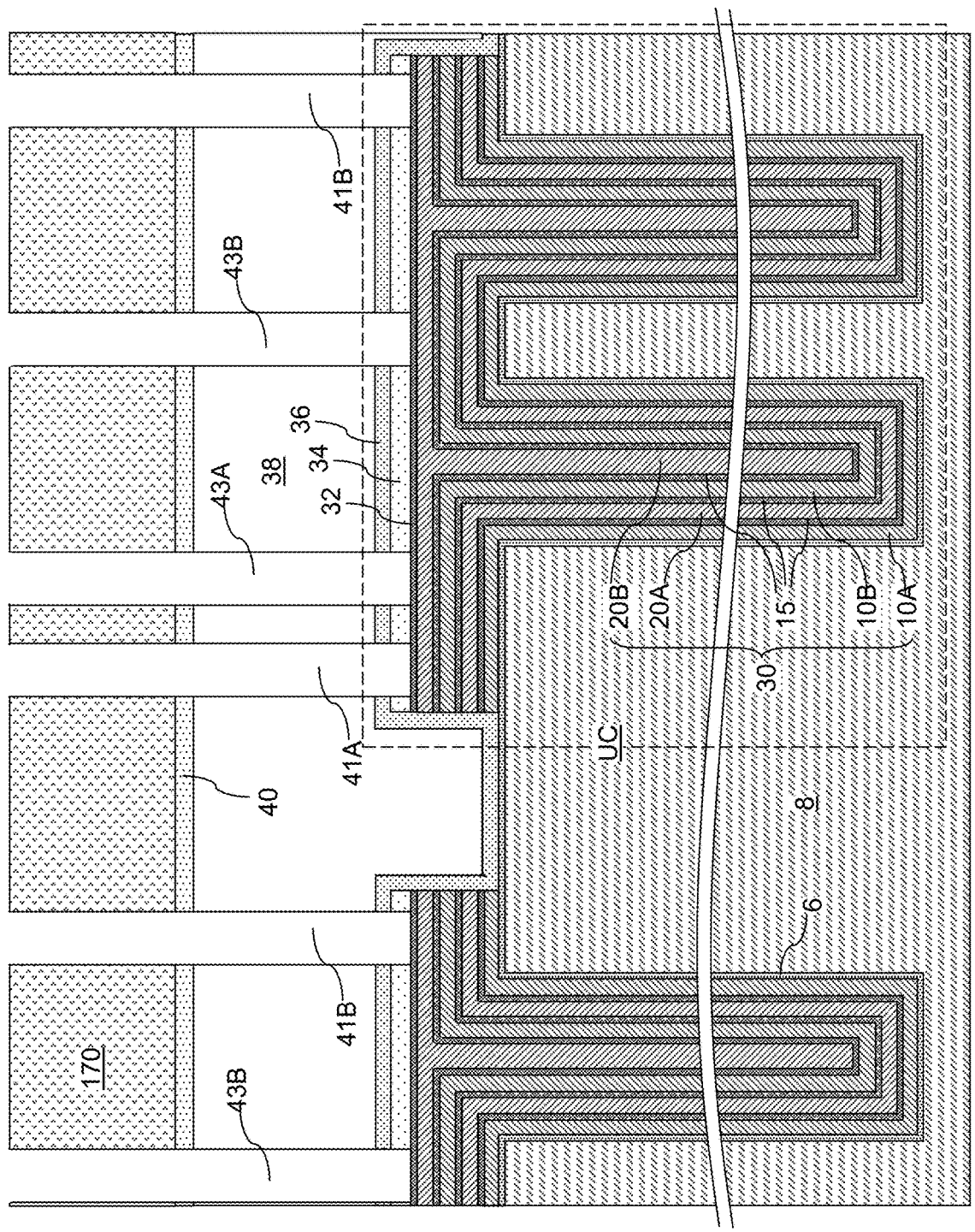
FIG. 5 is a vertical cross-sectional view of the exemplary structure after formation of contact via cavities according to an embodiment of the present disclosure.

Referring to FIG. 5, a photoresist layer 170 may be applied over the dielectric capping layer 40. The photoresist layer 170 may be lithographically patterned to form discrete openings therethrough. At least as many openings may be formed in the photoresist layer 170 within each area of a unit capacitor region UC as the total number of metallic electrode plates (10A, 20A, 10B, 20B) within an alternating layer stack 30. In one embodiment, the total number of openings through the photoresist layer 170 within each area of a unit capacitor region UC may be the same as, or may be integer multiples of, the total number of metallic electrode plates (10A, 20A, 10B, 20B) within an alternating layer stack 30.

An anisotropic etch process may be performed to transfer the pattern of the openings in the photoresist layer 170 through the dielectric capping layer 40, the contact-level dielectric layer 38, the etch stop dielectric layer 36, and the optional dielectric spacer layer 34. A sequence of etch steps that etches a dielectric material of a physically exposed dielectric material portion at a bottommost surface of cavities selective to an underlying dielectric material can be used to etch through unmasked portions of the dielectric capping layer 40, the contact-level dielectric layer 38, the etch stop dielectric layer 36, and the optional dielectric spacer layer 34. The terminal step of the anisotropic etch process that etches the dielectric spacer layer 34 (or the etch stop dielectric layer 36 in case the dielectric spacer layer 34 is omitted) can be selective to the material of the node dielectric material layer 32.

Contact via cavities (41A, 43A, 41B, 43B) may formed through the stack of the dielectric capping layer 40, the contact-level dielectric layer 38, the etch stop dielectric layer 36, and the optional dielectric spacer layer 34. Each of the contact via cavities (41A, 43A, 41B, 43B) may have a respective set of at least one straight sidewall that vertically extends from the top surface of the dielectric capping layer 40 to the top surface of the node dielectric material layer 32. Each straight sidewall of the via cavities (41A, 43A, 41B, 43B) may be vertical, or may have a finite taper angle that is greater than zero. The taper angle of the sidewalls of the via cavities (41A, 43A, 41B, 43B) may be less than 5 degrees, and/or may be less than 2 degrees. The via cavities (41A, 43A, 41B, 43B) may have the same depth, which is the sum of the thicknesses of the dielectric capping layer 40, the contact-level dielectric layer 38, the etch stop dielectric layer 36, and the optional dielectric spacer layer 34. A portion of a top surface of the node dielectric material layer 32 may be physically exposed at the bottom of each contact via cavity (41A, 43A, 41B, 43B). Each of the contact via cavities (41A, 43A, 41B, 43B) may have a bottom surface located above the topmost layer within the alternating layer stack 30.

The contact via cavities (41A, 43A, 41B, 43B) may include primary-node contact via cavities (41A, 43A) and complementary-node contact via cavities (41B, 43B). The primary-node contact via cavities (41A, 43A) may be cavities that are subsequently used to provide electrical contact to components of a primary electrode assembly. The primary electrode assembly may include at least two primary node metallic plates such as the first metallic electrode plate 10A and the third metallic electrode plate 10B. For example, the primary-node contact via cavities (41A, 43A) may include first contact via cavities 41A (which include a first subset of the contact via cavities) that may be subsequently used to form plate contact via structures contacting a respective first metallic electrode plate 10A, and third contact via cavities 43A (which include a third subset of the contact via cavities) that may be subsequently used to form plate contact via structures contacting a respective third metallic electrode plate 10B. The complementary-node contact via cavities (41B, 43B) may be cavities that may be subsequently used to provide electrical contact to components of a complementary electrode assembly including at least one complementary node metallic plate such as the second metallic electrode plate 20A and the fourth metallic electrode plate 20B. For example, the complementary-node contact via cavities (41B, 43B) may include second contact via cavities 41B (which include a second subset of the contact via cavities) that may be subsequently used to form plate contact via structures contacting a respective second metallic electrode plate 10B, and fourth contact via cavities 43B that may be subsequently used to form plate contact via structures contacting a respective fourth metallic electrode plate 20B. The photoresist layer 170 may be subsequently removed, for example, by ashing.

Figure 6A:
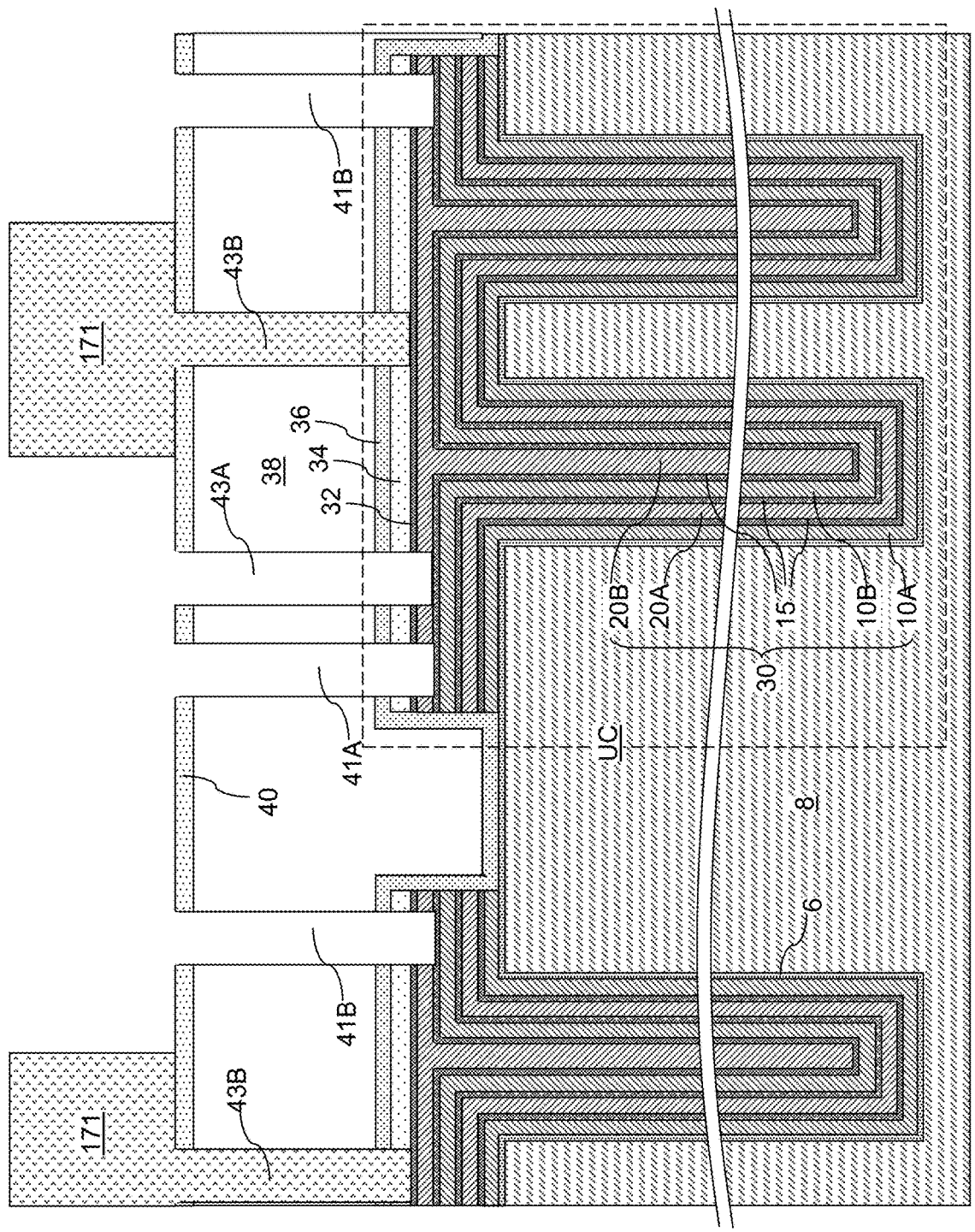
FIGS. 6A-6C are sequential vertical cross-sectional views of the exemplary structure during selective vertical extension of the contact via cavities according to a first patterning scheme according to an embodiment of the present disclosure.
Figure 6B:
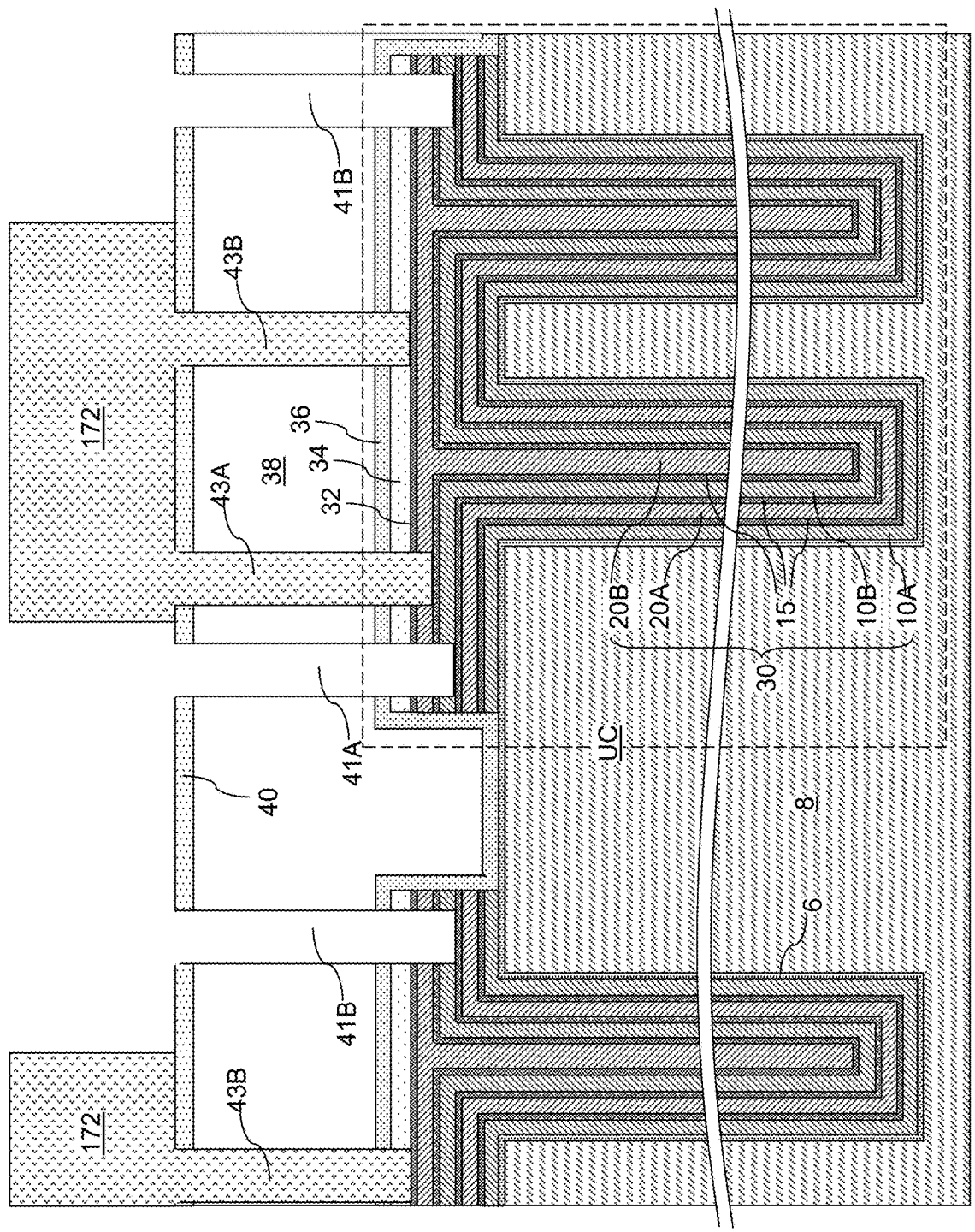
Figure 6C:
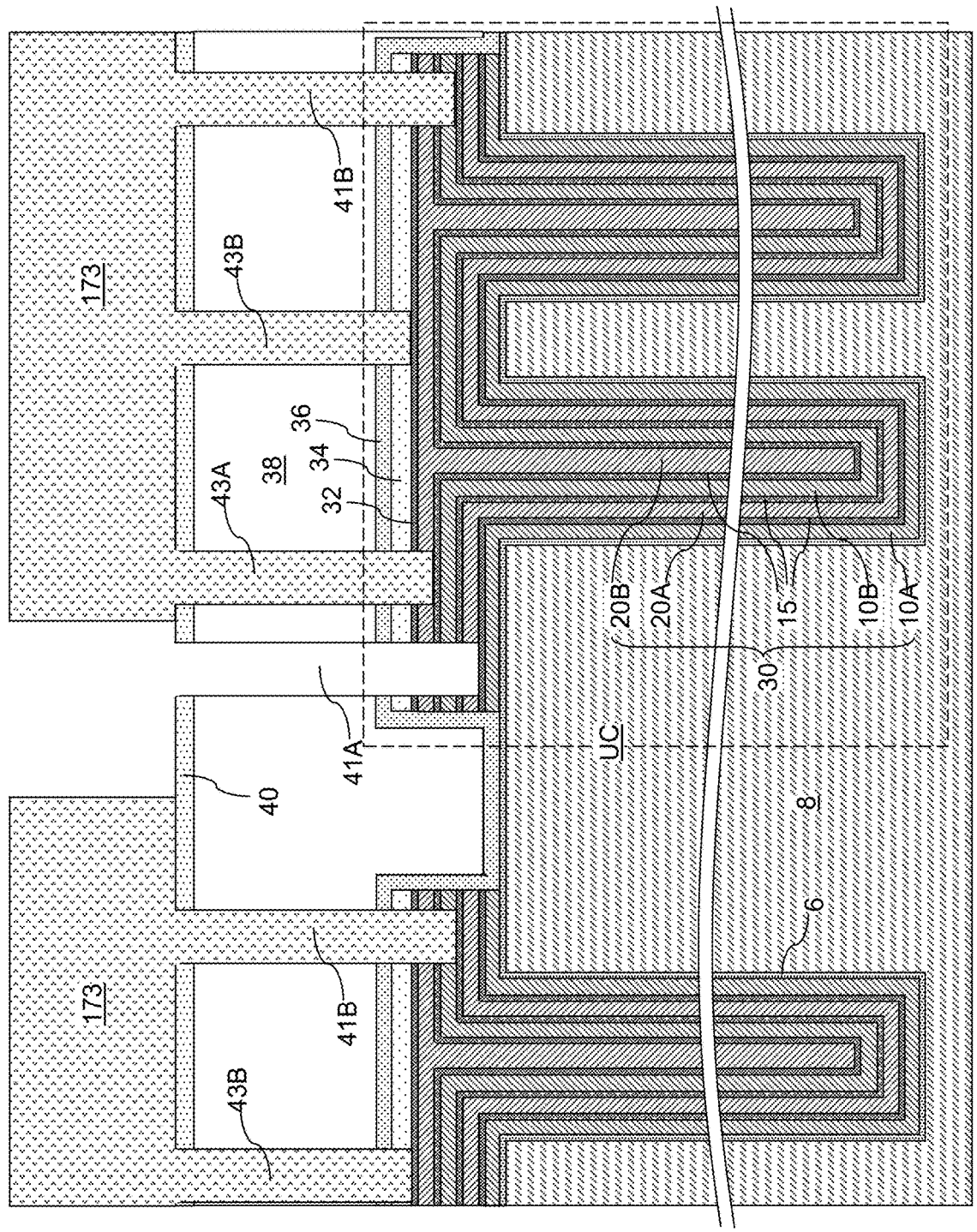

FIGS. 6A-6C are sequential vertical cross-sectional views of the exemplary structure during selective vertical extension of the contact via cavities (41A, 41B, 43A, 43B) according to a first patterning scheme according to an embodiment of the present disclosure. Generally, the depth of each subset of the contact via cavities (41A, 41B, 43A, 43B) may be selectively increased by performing at least twice a combination of processing steps that includes an etch mask formation process and an etch process. Each of FIGS. 6A-6C illustrate a respective combination of processing steps that include an etch mask formation process and an etch process.

Referring to FIG. 6A, a first patterned photoresist layer 171 may be applied over the dielectric capping layer 40 and the contact-level dielectric layer 38. The first patterned photoresist layer 171 may be lithographically patterned to cover the fourth contact via cavities 43B and not to cover the first contact via cavities 41A, the second contact via cavities 41B, or the third contact via cavities 43A. The first patterned photoresist layer 171 may function as an etch mask for a subsequent etch process, which is herein referred to as a first etch process. The first etch process etches through unmasked portions of the node dielectric material layer 32 and unmasked portions of a metallic electrode plate, which can be the fourth metallic electrode plate 20B. In one embodiment, each metallic electrode plate (10A, 10B, 20A, 20B) may include, and/or can consist essentially of, a conductive metallic nitride material, and each node dielectric layer 15 and the node dielectric material layer 32 can include, and/or can consist essentially of, a dielectric metal oxide material having a dielectric constant greater than 7.9. In an embodiment, the first etch process may include a first step that etches the dielectric metal oxide material selective to the conductive metallic nitride material, and a second step that etches the conductive metallic nitride material selective to the dielectric metal oxide material. The first etch step may include a first anisotropic etch step having an etch chemistry that etches the dielectric metal oxide material selective to the conductive metallic nitride material. The second etch step may include a second anisotropic etch step having an etch chemistry that etches the conductive metallic nitride material selective to the dielectric metal oxide material. The duration of each etch step may be selected such that each of the first contact via cavities 41A, the second contact via cavities 41B, and the third contact via cavities 43A may be vertically extended to a top surface of a topmost node dielectric layer 15, which is located within a same horizontal plane as the bottom surface of the fourth metallic electrode plate 20B. The first patterned photoresist layer 171 can be subsequently removed, for example, by ashing.

Referring to FIG. 6B, a second patterned photoresist layer 172 may be applied over the dielectric capping layer 40 and the contact-level dielectric layer 38. The second patterned photoresist layer 172 may be lithographically patterned to cover the third contact via cavities 43A and the fourth contact via cavities 43B and not to cover the first contact via cavities 41A or the second contact via cavities 41B. The second patterned photoresist layer 172 may function as an etch mask for a subsequent etch process, which is herein referred to as a second etch process. The second etch process etches through unmasked portions of the topmost node dielectric layer 15 and unmasked portions of a metallic electrode plate, which can be the third metallic electrode plate 20A. In embodiments in which each metallic electrode plate (10A, 10B, 20A, 20B) includes, and/or consists essentially of, a conductive metallic nitride material, and each node dielectric layer 15 and the node dielectric material layer 32 includes, and/or consists essentially of, a dielectric metal oxide material having a dielectric constant greater than 7.9, the second etch process may include a first step that etches the dielectric metal oxide material selective to the conductive metallic nitride material, and a second step that etches the conductive metallic nitride material selective to the dielectric metal oxide material. The first etch step may include a first anisotropic etch step having an etch chemistry that etches the dielectric metal oxide material selective to the conductive metallic nitride material. The second etch step may include a second anisotropic etch step having an etch chemistry that etches the conductive metallic nitride material selective to the dielectric metal oxide material. The duration of each etch step may be selected such that each of the first contact via cavities 41A and the second contact via cavities 41B may be vertically extended to a top surface of a middle node dielectric layer 15, which is located within a same horizontal plane as the bottom surface of the third metallic electrode plate 20A. The second patterned photoresist layer 172 can be subsequently removed, for example, by ashing.

Referring to FIG. 6C, a third patterned photoresist layer 173 may be applied over the dielectric capping layer 40 and the contact-level dielectric layer 38. The third patterned photoresist layer 173 may be lithographically patterned to cover the second contact via cavities 41B, the third contact via cavities 43A, and the fourth contact via cavities 43B and not to cover the first contact via cavities 41A. The third patterned photoresist layer 173 may function as an etch mask for a subsequent etch process, which is herein referred to as a third etch process. The third etch process etches through unmasked portions of the middle node dielectric layer 15 and unmasked portions of a metallic electrode plate, which may be the second metallic electrode plate 10B. In embodiments in which each metallic electrode plate (10A, 10B, 20A, 20B) includes, and/or consists essentially of, a conductive metallic nitride material, and each node dielectric layer 15 and the node dielectric material layer 32 includes, and/or consists essentially of, a dielectric metal oxide material having a dielectric constant greater than 7.9, the third etch process may include a first step that etches the dielectric metal oxide material selective to the conductive metallic nitride material, and a second step that etches the conductive metallic nitride material selective to the dielectric metal oxide material. The first etch step may include a first anisotropic etch step having an etch chemistry that etches the dielectric metal oxide material selective to the conductive metallic nitride material. The second etch step may include a second anisotropic etch step having an etch chemistry that etches the conductive metallic nitride material selective to the dielectric metal oxide material. The duration of each etch step may be selected such that each of the first contact via cavities 41A may be vertically extended to a top surface of the bottommost node dielectric layer 15, which is located within a same horizontal plane as the bottom surface of the second metallic electrode plate 10B. The third patterned photoresist layer 173 can be subsequently removed, for example, by ashing.

Figure 7A:
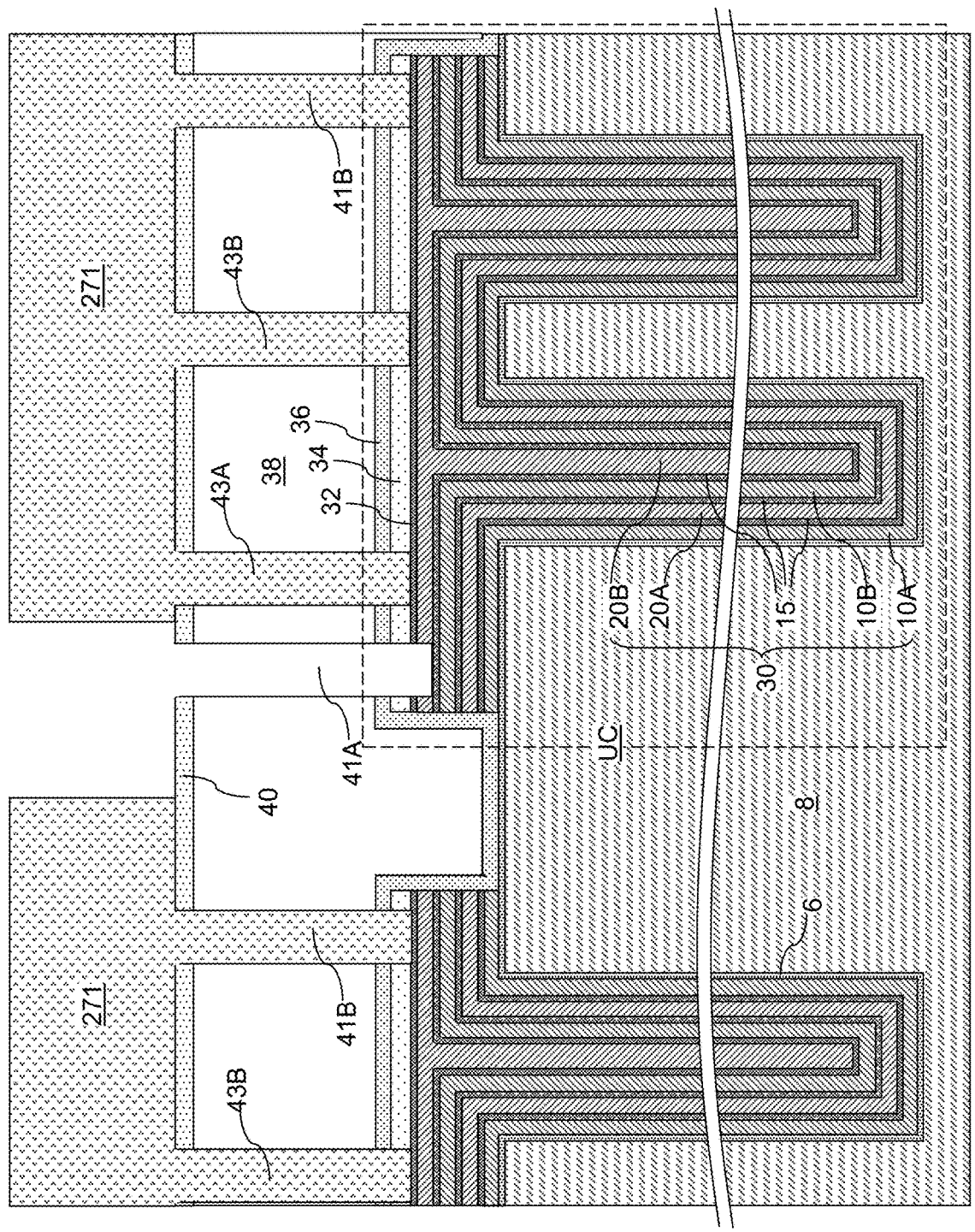
FIGS. 7A-7C are sequential vertical cross-sectional views of the exemplary structure during selective vertical extension of the contact via cavities according to a second patterning scheme according to an embodiment of the present disclosure.
Figure 7B:
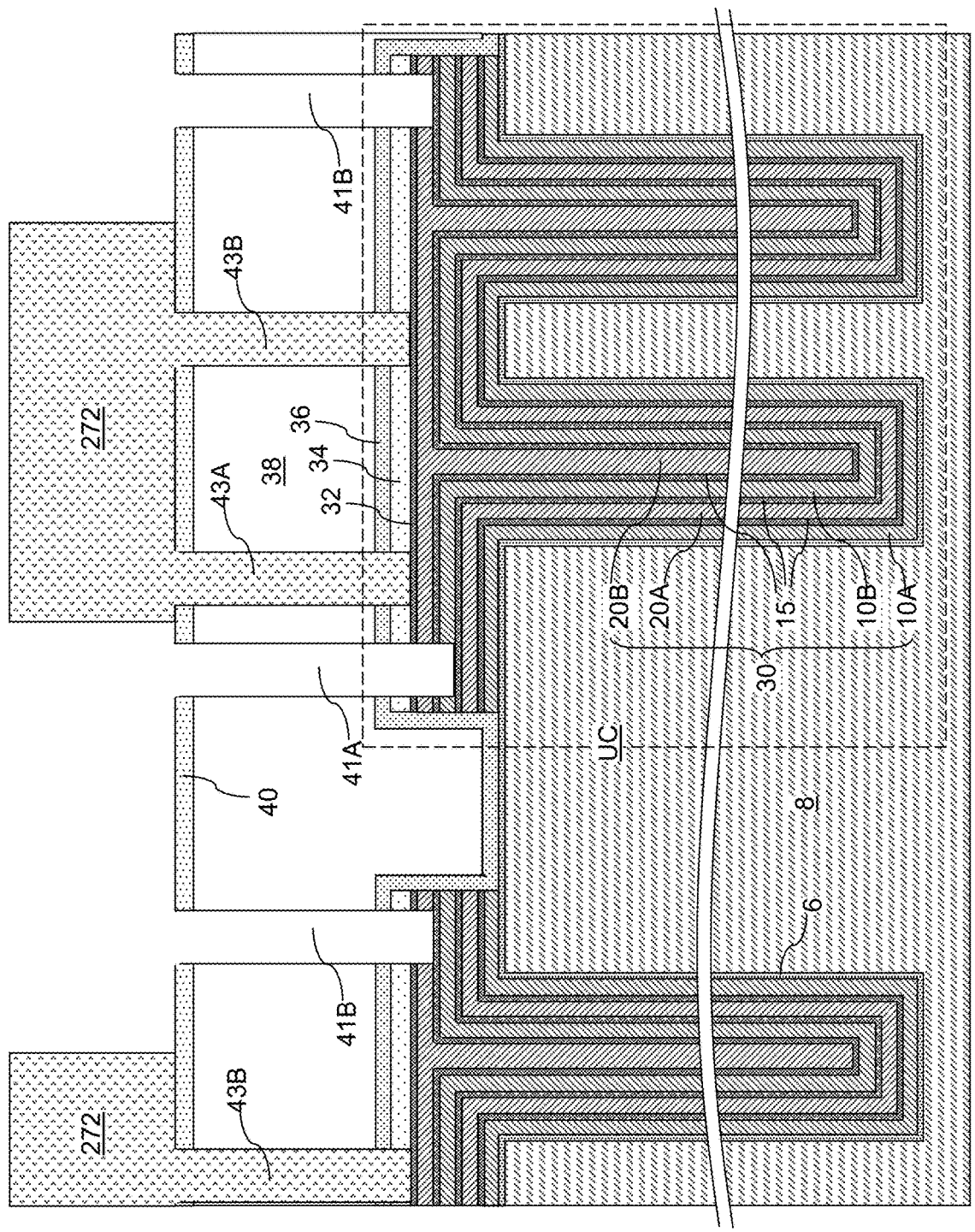
Figure 7C:
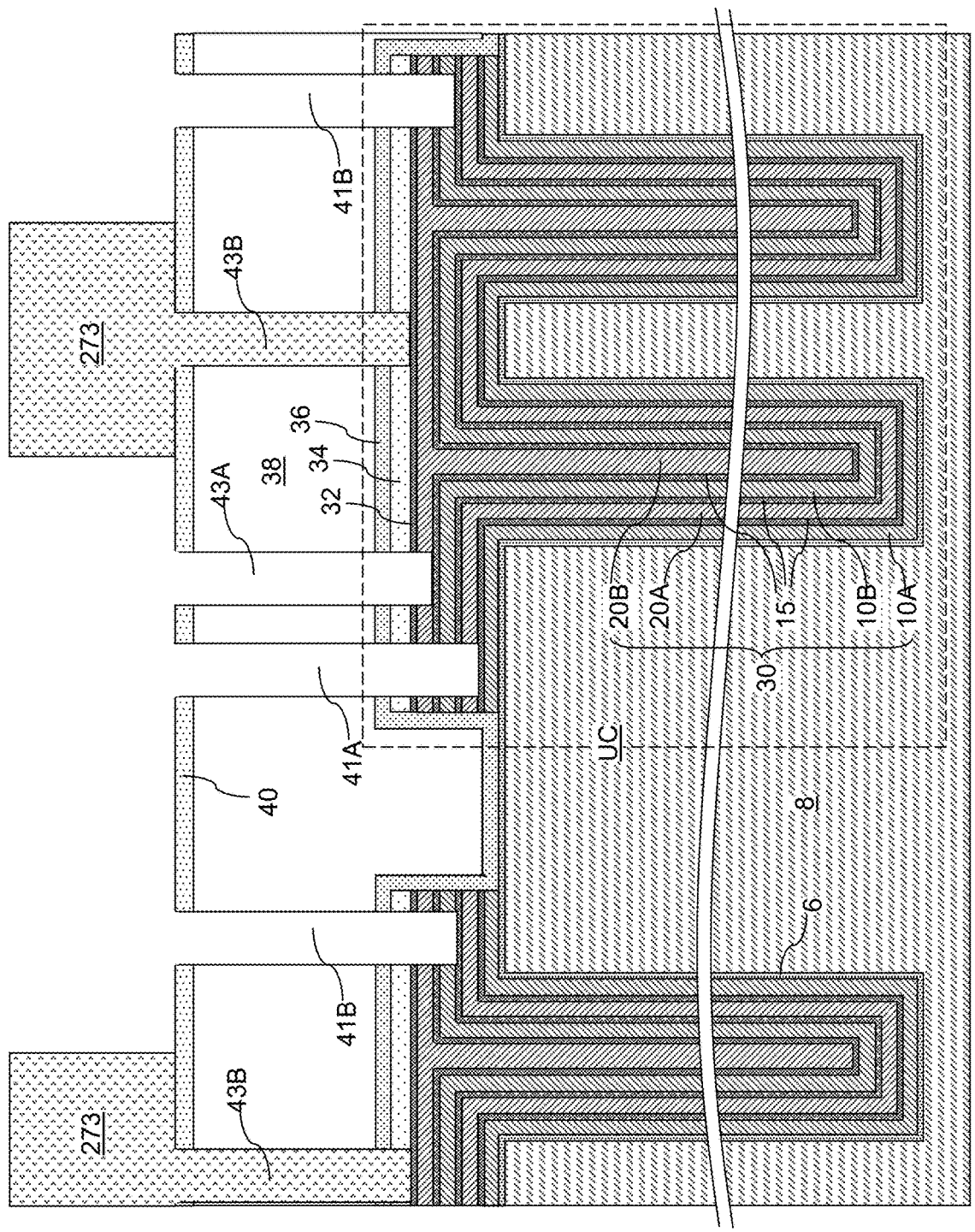

FIGS. 7A-7C are sequential vertical cross-sectional views of the exemplary structure during selective vertical extension of the contact via cavities (41A, 41B, 43A, 43B) according to a second patterning scheme according to an embodiment of the present disclosure. As discussed above, the depth of each subset of the contact via cavities (41A, 41B, 43A, 43B) can be selectively increased by performing at least twice a combination of processing steps that includes an etch mask formation process and an etch process. Each of FIGS. 7A-7C illustrate a respective combination of processing steps that include an etch mask formation process and an etch process.

Referring to FIG. 7A, a first patterned photoresist layer 271 may be applied over the dielectric capping layer 40 and the contact-level dielectric layer 38. The first patterned photoresist layer 271 may be lithographically patterned to cover the second contact via cavities 41B, the third contact via cavities 43A, and the fourth contact via cavities 43B and not to cover the first contact via cavities 41A. The first patterned photoresist layer 271 may function as an etch mask for a subsequent etch process, which is herein referred to as a first etch process. The first etch process etches through unmasked portions of the node dielectric material layer 32 and unmasked portions of a metallic electrode plate, which can be the fourth metallic electrode plate 20B. In one embodiment, each metallic electrode plate (10A, 10B, 20A, 20B) may include, and/or may consist essentially of, a conductive metallic nitride material, and each node dielectric layer 15 and the node dielectric material layer 32 may include, and/or may consist essentially of, a dielectric metal oxide material having a dielectric constant greater than 7.9. In such an embodiment, the first etch process may include a first step that etches the dielectric metal oxide material selective to the conductive metallic nitride material. The second step may etch the conductive metallic nitride material selective to the dielectric metal oxide material. The first etch step can include a first anisotropic etch step having an etch chemistry that etches the dielectric metal oxide material selective to the conductive metallic nitride material. The second etch step can include a second anisotropic etch step having an etch chemistry that etches the conductive metallic nitride material selective to the dielectric metal oxide material. The duration of each etch step may be selected such that each of the first contact via cavities 41A is vertically extended to a top surface of a topmost node dielectric layer 15, which is located within a same horizontal plane as the bottom surface of the fourth metallic electrode plate 20B.

In one embodiment, the first patterned photoresist layer 271 may be subsequently removed, for example, by ashing. In another embodiment, the first patterned photoresist layer 271 may include a trimmable photoresist material that can be isotropically trimmed by a controlled ashing process. In such embodiments, the second contact via cavities 41B, the third contact via cavities 43A, and the fourth contact via cavities 43B may be geometrically arranged such that the third contact via cavities 43A and the fourth contact via cavities 43B may remain covered by a trimmed portion of the trimmable photoresist material after a trimming process, while the second contact via cavities 41B may become physically exposed, i.e., are not covered by the trimmed portion of the trimmable photoresist material. In such an embodiment, the trimmed portion of the trimmable photoresist material may function as a second patterned photoresist layer 272 illustrated in FIG. 7B.

Referring to FIG. 7B, a second patterned photoresist layer 272 may be provided as trimmed portions of the trimmable photoresist material. Alternatively, the first patterned photoresist layer 271 may be removed by ashing, and a second photoresist material may be applied over the dielectric capping layer 40 and the contact-level dielectric layer 38. The second photoresist material may be lithographically patterned to provide the second patterned photoresist layer 272. The second patterned photoresist layer 272 covers the third contact via cavities 43A and the fourth contact via cavities 43B, and does not cover the first contact via cavities 41A or the second contact via cavities 41B. The second patterned photoresist layer 272 may function as an etch mask for a subsequent etch process, which is herein referred to as a second etch process. The second etch process may etch through unmasked portions of the node dielectric material layer 32 and the topmost node dielectric layer 15, and then underlying unmasked portions of a metallic electrode plate, which can be the third metallic electrode plate 20A for each first contact via cavity 41A or the fourth metallic electrode plate 20B for each second contact via cavity 41B. In embodiments in which each metallic electrode plate (10A, 10B, 20A, 20B) includes, and/or consists essentially of, a conductive metallic nitride material, and each node dielectric layer 15 and the node dielectric material layer 32 includes, and/or consists essentially of, a dielectric metal oxide material having a dielectric constant greater than 7.9, the second etch process may include a first step that etches the dielectric metal oxide material selective to the conductive metallic nitride material, and a second step that etches the conductive metallic nitride material selective to the dielectric metal oxide material. The first etch step may include a first anisotropic etch step having an etch chemistry that etches the dielectric metal oxide material selective to the conductive metallic nitride material. The second etch step may include a second anisotropic etch step having an etch chemistry that etches the conductive metallic nitride material selective to the dielectric metal oxide material. The duration of each etch step may be selected such that each of the first contact via cavities 41A is vertically extended to a top surface of a middle node dielectric layer 15, which is located within a same horizontal plane as the bottom surface of the third metallic electrode plate 20A. Each of the second contact via cavities 41B is vertically extended to a top surface of a top node dielectric layer 15, which is located within a same horizontal plane as the bottom surface of the fourth metallic electrode plate 20B.

In an embodiment, the second patterned photoresist layer 272 may be subsequently removed, for example, by ashing. In another embodiment, the second patterned photoresist layer 272 may include a trimmable photoresist material that may be isotropically trimmed by a controlled ashing process. In such embodiments, the third contact via cavities 43A and the fourth contact via cavities 43B may be geometrically arranged such that the fourth contact via cavities 43B may remain covered by a trimmed portion of the trimmable photoresist material after a trimming process, while the third contact via cavities 43A become physically exposed, i.e., are not covered by the trimmed portion of the trimmable photoresist material. In this case, the trimmed portion of the trimmable photoresist material can function as a third patterned photoresist layer 273 illustrated in FIG. 7C.

Referring to FIG. 7C, a third patterned photoresist layer 273 may be provided as trimmed portions of the trimmable photoresist material. Alternatively, the second patterned photoresist layer 272 may be removed by ashing, and a third photoresist material may be applied over the dielectric capping layer 40 and the contact-level dielectric layer 38, and may be lithographically patterned to provide the third patterned photoresist layer 273. The third patterned photoresist layer 273 may cover the fourth contact via cavities 43B, and does not cover the first contact via cavities 41A, the second contact via cavities 41B, or the third contact via cavities 43A. The third patterned photoresist layer 273 may function as an etch mask for a subsequent etch process, which is herein referred to as a third etch process. The third etch process etches through unmasked portions of the node dielectric material layer 32, the topmost node dielectric layer 15, and the middle node dielectric layer 15, and then underlying unmasked portions of a metallic electrode plate, which can be the second metallic electrode plate 10B for each first contact via cavity 41A, the third metallic electrode plate 20A for each second contact via cavity 41B, or the fourth metallic plate 20B for each third contact via cavity 43A. In embodiments in which each metallic electrode plate (10A, 10B, 20A, 20B) includes, and/or consists essentially of, a conductive metallic nitride material, and each node dielectric layer 15 and the node dielectric material layer 32 includes, and/or consists essentially of, a dielectric metal oxide material having a dielectric constant greater than 7.9, the third etch process can include a first step that etches the dielectric metal oxide material selective to the conductive metallic nitride material, and a second step that etches the conductive metallic nitride material selective to the dielectric metal oxide material. The first etch step may include a first anisotropic etch step having an etch chemistry that etches the dielectric metal oxide material selective to the conductive metallic nitride material. The second etch step may include a second anisotropic etch step having an etch chemistry that etches the conductive metallic nitride material selective to the dielectric metal oxide material. The duration of each etch step may be selected such that each of the first contact via cavities 41A is vertically extended to a top surface of a bottom node dielectric layer 15, which is located within a same horizontal plane as the bottom surface of the second metallic electrode plate 10A. Each of the second contact via cavities 41B is vertically extended to a top surface of a middle node dielectric layer 15, which is located within a same horizontal plane as the bottom surface of the third metallic electrode plate 20A. Each of the third contact via cavities 43A is vertically extended to a top surface of a top node dielectric layer 15, which is located within a same horizontal plane as the bottom surface of the fourth metallic electrode plate 20B. The third patterned photoresist layer 273 may be subsequently removed, for example, by ashing.

Figure 8:
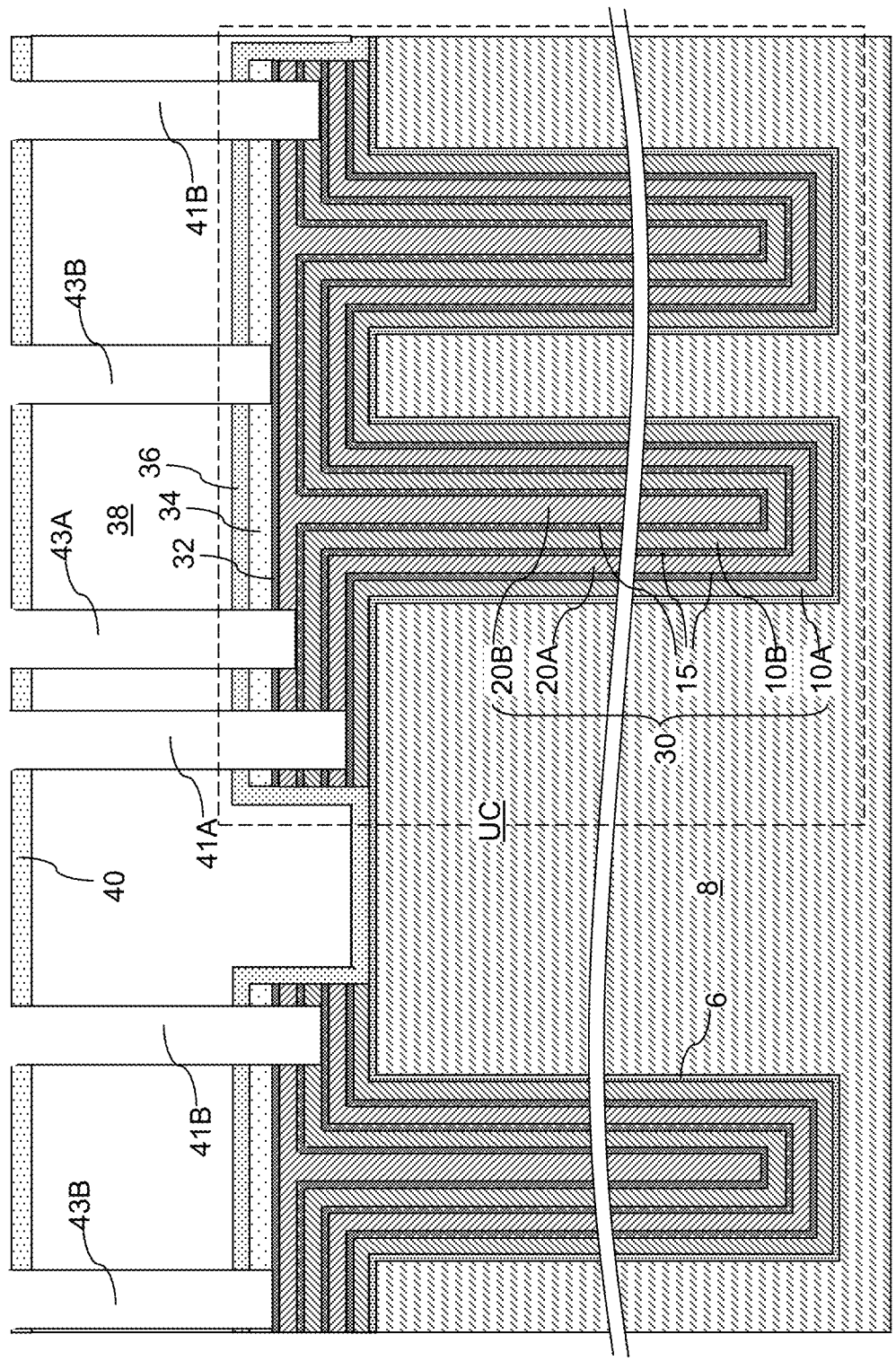
FIG. 8 is a vertical cross-sectional view of the exemplary structure after selective vertical extension of the contact via cavities according to an embodiment of the present disclosure.

FIG. 8 illustrates the exemplary structure after removal of the third patterned photoresist layer (173, 273). While the present disclosure is described using an embodiment in which four metallic electrode plates (10A, 10B, 20A, 20B) are used, embodiments are expressly contemplated herein in which a different total number of metallic electrode plates are used within each alternating layer stack of metallic electrode plates and node dielectric layers 15. In such embodiments, multiple sets of contact via cavities vertically extending to top surfaces of different node dielectric layers 15 or to a top surface of the node dielectric material layer 32 may be formed. Each node dielectric layer 15 within each alternating layer stack and the node dielectric material layer 32 that overlies a respective alternating layer stack 30 may have a respective portion of a top surface that is physically exposed to an overlying one of the contact via cavities (41A, 41B, 43A, 43B).

Figure 9:
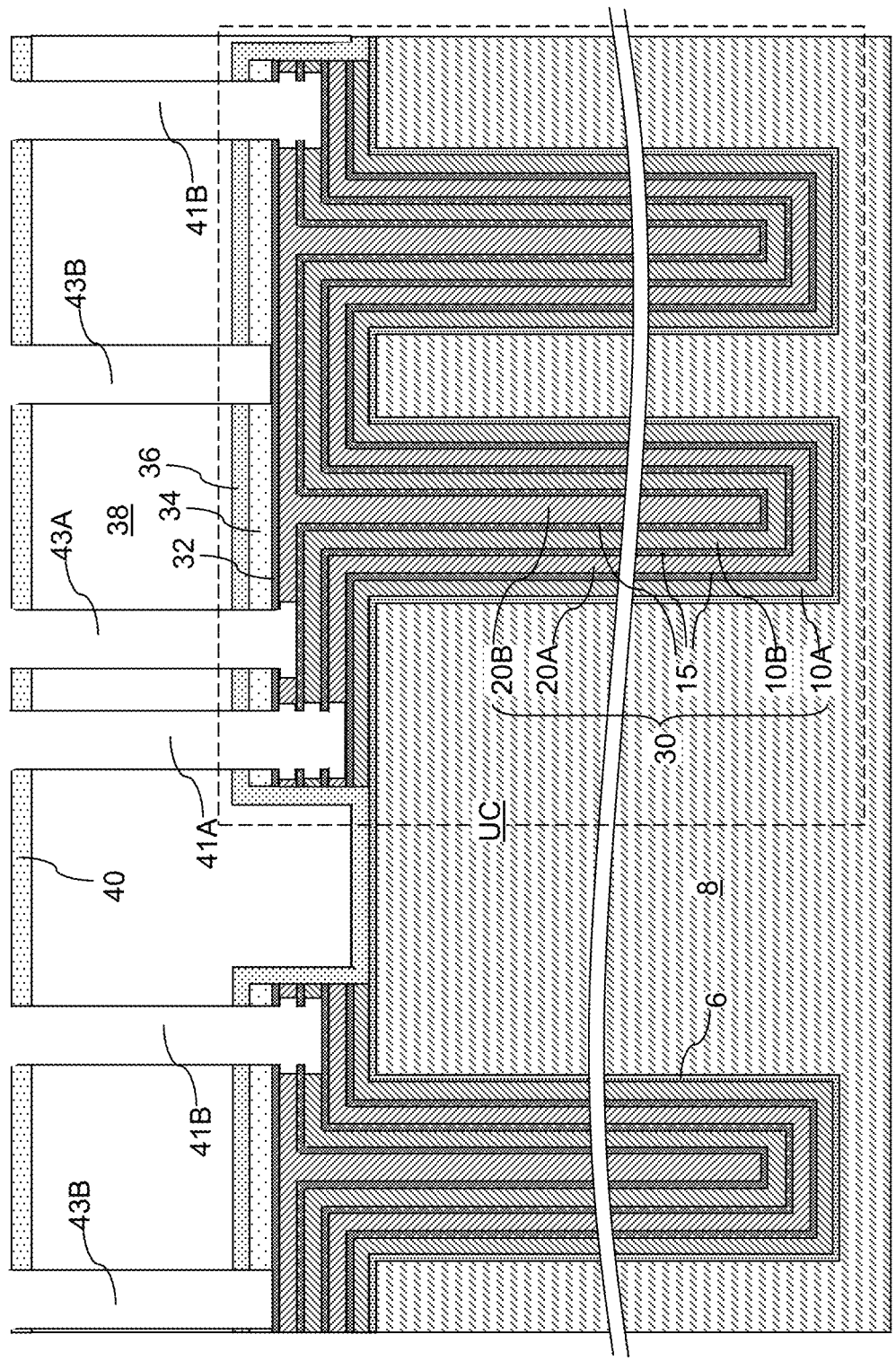
FIG. 9 is a vertical cross-sectional view of the exemplary structure after laterally recessing horizontal portions of the metallic electrode plates around each contact via cavity according to an embodiment of the present disclosure.

Referring to FIG. 9, physically exposed sidewalls of the metallic electrode plates (10A, 10B, 20A, 20B) may be laterally recessed selective to the node dielectric layers 15 and the node dielectric material layer 32. For example, if the metallic electrode plates (10A, 10B, 20A, 20B) include a metallic nitride material and if the node dielectric layers 15 and the node dielectric material layer 32 include a dielectric metal oxide material, a wet etch process that etches the metallic nitride material selective to the dielectric metal oxide material may be performed. For example, a wet etch solution including diluted ammonium hydroxide and optionally hydrogen peroxide may be used to laterally recess the physically exposed sidewalls of the metallic electrode plates (10A, 10B, 20A, 20B) around each contact via cavity (41A, 41B, 43A, 43B) selective to the dielectric metal oxide material of the node dielectric layers 15 and the node dielectric material layer 32. The lateral recess distance of the isotropic etch process may be in a range from 1 nm to 10 nm, although lesser and greater lateral etch distances can also be used.

Generally, the physically exposed sidewalls of horizontally-extending portions of at least three metallic electrode plates (10A, 10B, 20A, 20B) may be laterally recessed by isotropically etching the conductive metallic nitride material of the at least three metallic electrode plates (10A, 10B, 20A, 20B) selective to the dielectric metal oxide material of the node dielectric layers 15 after performing at least twice the combination of processing steps that vertically extends the contact via cavities (41A, 41B, 43A, 43B) at the processing steps of FIGS. 6A-6C or FIGS. 7A-7C. The bottommost metallic electrode plate (such as the first metallic electrode plate 10A) is not physically exposed to the isotropic etchant of the isotropic etch process. Each metallic electrode plate other than the bottommost electrode plate has at least one sidewall that is physically exposed to the isotropic etchant.

Figure 10:
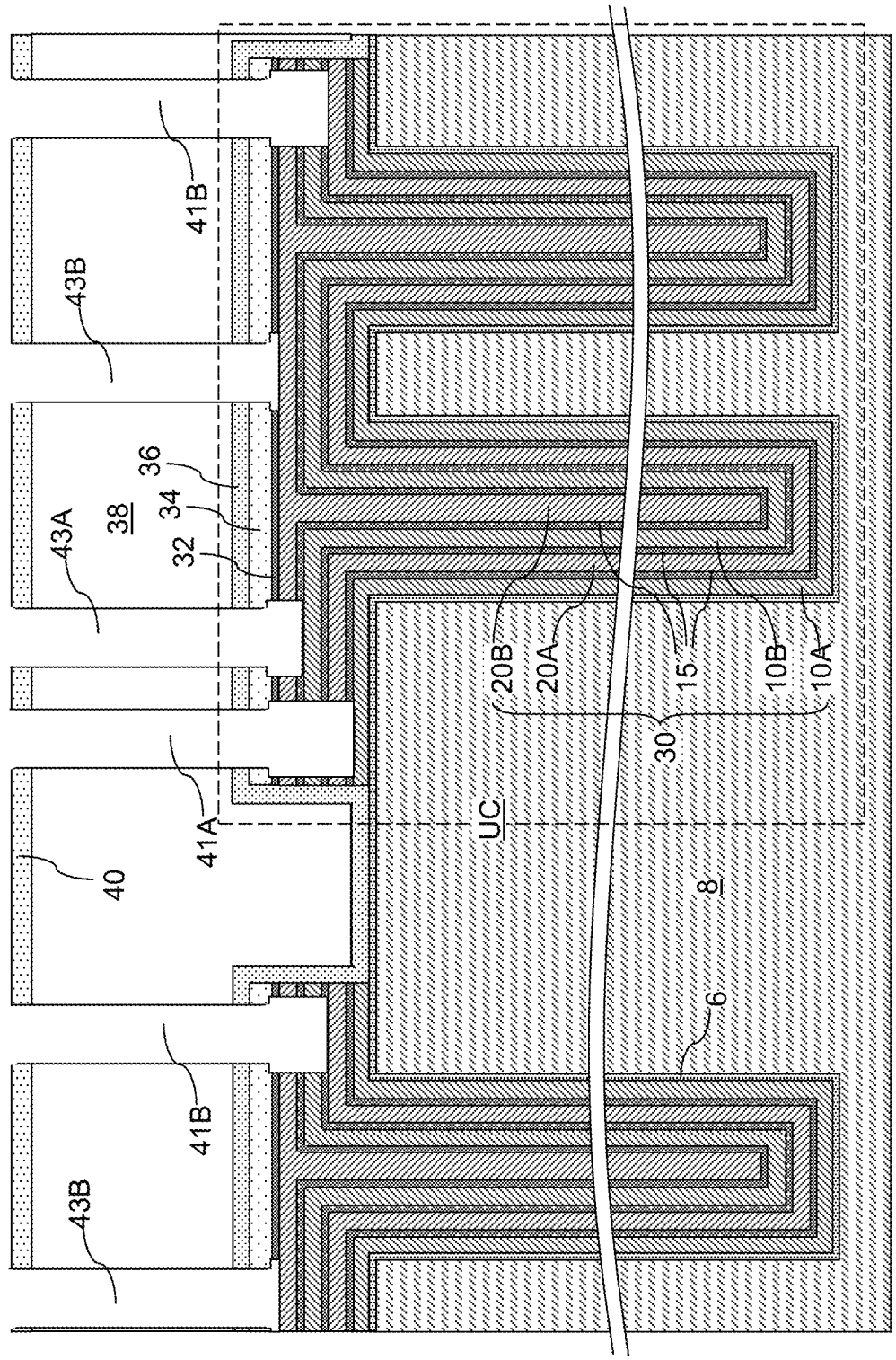
FIG. 10 is a vertical cross-sectional view of the exemplary structure after a terminal node dielectric etch process according to an embodiment of the present disclosure.

Referring to FIG. 10, a terminal node dielectric etch process may be performed. The terminal node dielectric etch process may be an isotropic etch process that isotropically etches physically exposed portions of the node dielectric layers 15 and the node dielectric material layer 32 around, and underneath, each contact via cavity (41A, 41B, 43A, 43B). In one embodiment, the terminal node dielectric etch process can include a wet etch process that etches the dielectric metal oxide material of the node dielectric layers 15 and the node dielectric material layer 32 selective to the conductive metallic nitride material of the metallic electrode plates (10A, 10B, 20A, 20B). The duration of the terminal node dielectric etch process may be selected such that each portion of the node dielectric layers 15 and the node dielectric material layer 32 that underlies a contact via cavity (41A, 41B, 43A, 43B) is etched through, and a top surface of each underlying metallic electrode plate (10A, 10B, 20A, 20B) is physically exposed underneath each contact via cavity (41A, 41B, 43A, 43B).

The etch chemistry of the terminal node dielectric etch process may be selective to the material of the metallic electrode plates (10A, 10B, 20A, 20B), i.e., does not etch the material of the metallic electrode plate (10A, 10B, 20A, 20B). In such an embodiment, the bottom surface of each contact via cavity (41A, 41B, 43A, 43B) may be flush with the horizontal interface between a top surface of an underlying metallic electrode plate (10A, 10B, 20A, 20B) and a bottom surface of one of the node dielectric layers 15 and the node dielectric material layer 32 that contacts the underlying metallic electrode plate (10A, 10B, 20A, 20B). In other words, the bottom surface of each contact via cavity (41A, 41B, 43A, 43B) may be located within a horizontal plane including the top surface of a respective one of metallic electrode plates (41A, 41B, 43A, 43B) that directly underlies the respective contact via cavity (41A, 41B, 43A, 43B). Laterally protruding portions of the node dielectric layers 15 and the node dielectric material layer 32 located at peripheral portions of the contact via cavities (41A, 41B, 43A, 43B) may be collaterally removed during the terminal node dielectric etch process such that physically exposed sidewalls of the node dielectric layers 15 and the node dielectric material layer 32 may be approximately flush with the recessed sidewalls of the metallic electrode plates (10A, 10B, 20A, 20B). Thus, the contact via cavities (41A, 41B, 43A, 43B) may have bottle-shaped vertical cross-sectional profiles in which a bottommost portion of a contact via cavity (41A, 41B, 43A, 43B) has a greater lateral dimension than an overlying portion of the contact via cavity (41A, 41B, 43A, 43B) that has straight sidewalls.

Figure 11A:
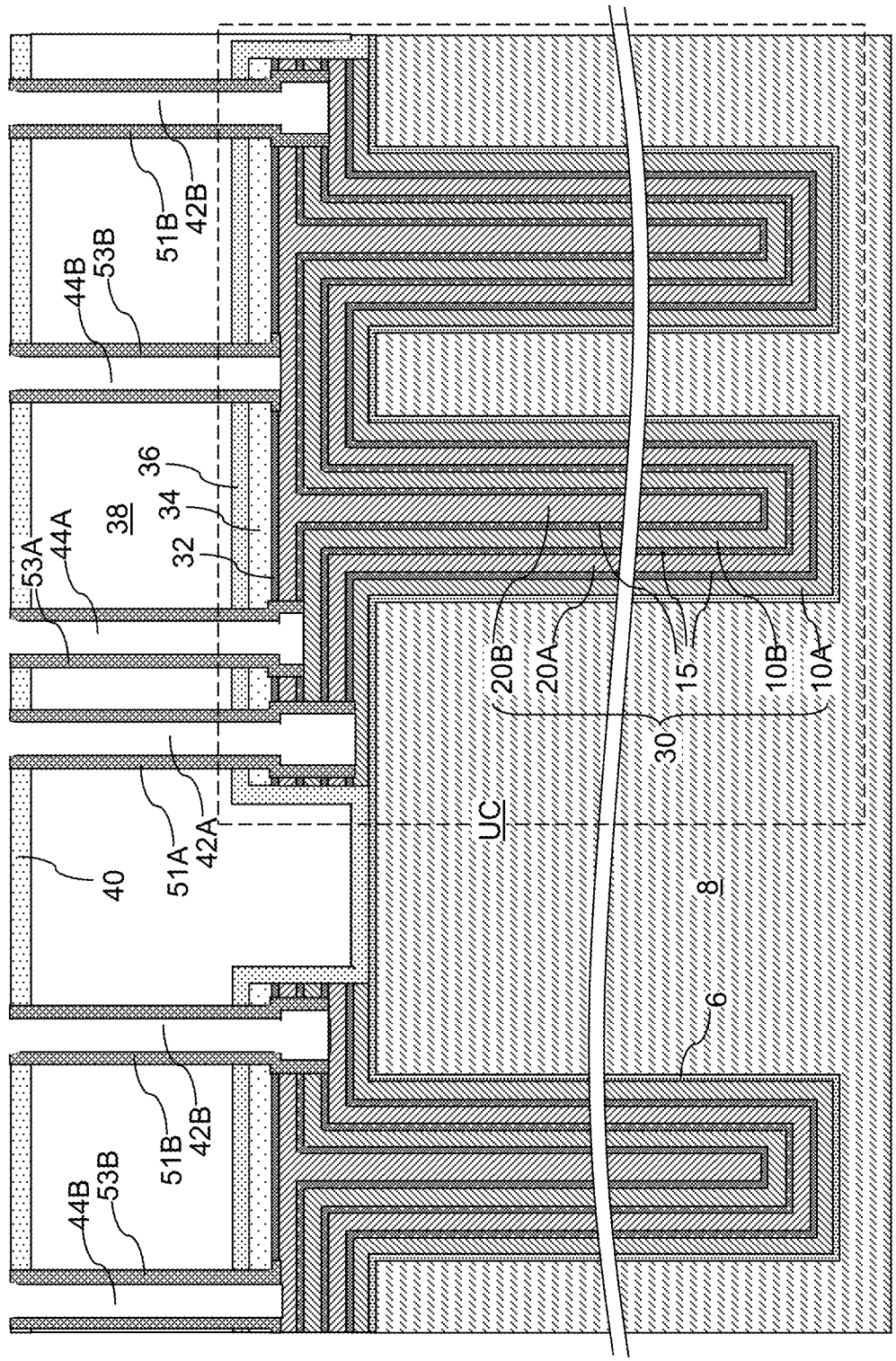
FIG. 11A is a vertical cross-sectional view of the exemplary structure after formation of dielectric contact via liners according to an embodiment of the present disclosure.

Referring to FIG. 11A, a continuous dielectric liner layer may be conformally deposited on sidewalls of the contact via cavities (41A, 41B, 43A, 43B), on physically exposed portions of top surfaces of the metallic electrode plates (10A, 10B, 20A, 20B), and over the contact-level dielectric layer 38. The continuous dielectric liner layer includes a dielectric material such as silicon nitride. Other suitable materials within the contemplated scope of disclosure may also be used. The continuous dielectric liner layer may be deposited by a conformal deposition process such as low pressure chemical vapor deposition. The continuous dielectric liner layer may have a thickness that is less than 25%, such as less than 10% and/or less than 5%, of the lateral dimension (such as a diameter) of each contact via cavity (41A, 41B, 43A, 43B). For example, the continuous dielectric liner layer may have a thickness in a range from 1 nm to 30 nm, although greater thicknesses can also be used.

An anisotropic etch process may be performed to remove horizontal portions of the continuous dielectric liner layer. Remaining vertical portions of the continuous dielectric liner layer constitutes dielectric contact via liners (51A, 51B, 53A, 53B). The dielectric contact via liners (51A, 51B, 53A, 53B) may include first dielectric contact via liners 51A formed in a respective one of the first contact via cavities 41A, second dielectric contact via liners 51B formed in a respective one of the second contact via cavities 41B, third dielectric contact via liners 53A formed in a respective one of the third contact via cavities 43A, and fourth dielectric contact via liners 53B formed in a respective one of the fourth contact via cavities 43B. Each dielectric contact via liner (51A, 51B, 53A, 53B) may have a uniform lateral thickness, which may be in a range from 1 nm to 30 nm.

Each of the dielectric contact via liners (51A, 51B, 53A, 53B) may have a tubular configuration, and may include a respective cylindrical inner sidewall and a respective outer sidewall that are laterally spaced from each other by a uniform lateral separation distance (i.e., the thickness of the contact via liner). Each void that is laterally enclosed by a first dielectric contact via liner 51A is herein referred to as a first void 42A, each void that is laterally enclosed by a second dielectric contact via liner 51B is herein referred to as a second void 42B, each void that is laterally enclosed by a third dielectric contact via liner 53A is herein referred to as a third void 44A, and each void that is laterally enclosed by a fourth dielectric contact via liner 53B is herein referred to as a fourth void 44B, Each of the first voids 42A, the second voids 42B, and the third voids 44A may have a bulging portion at a bottommost portion that overlies a physically exposed top surface of a respective metallic electrode plate (10A, 10B, 20A, 20B), Each first dielectric contact via liner 51A may contact sidewalls of horizontally-extending portions of at least two metallic electrode plates selected from the at least three metallic electrode plates, such as the sidewalls of a second metallic electrode plate 10B, a third metallic electrode plate 20A, and a fourth metallic electrode plate 20B. Each second dielectric contact via liner 51B may contact sidewalls of a horizontally-extending portion of at least one metallic electrode plate selected from the at least three metallic electrode plates, such as the sidewalls of a third metallic electrode plate 20A and a fourth metallic electrode plate 20B. Each third dielectric contact via liner 53A may contact a sidewall of a fourth metallic electrode plate 20B.

Figure 11B:
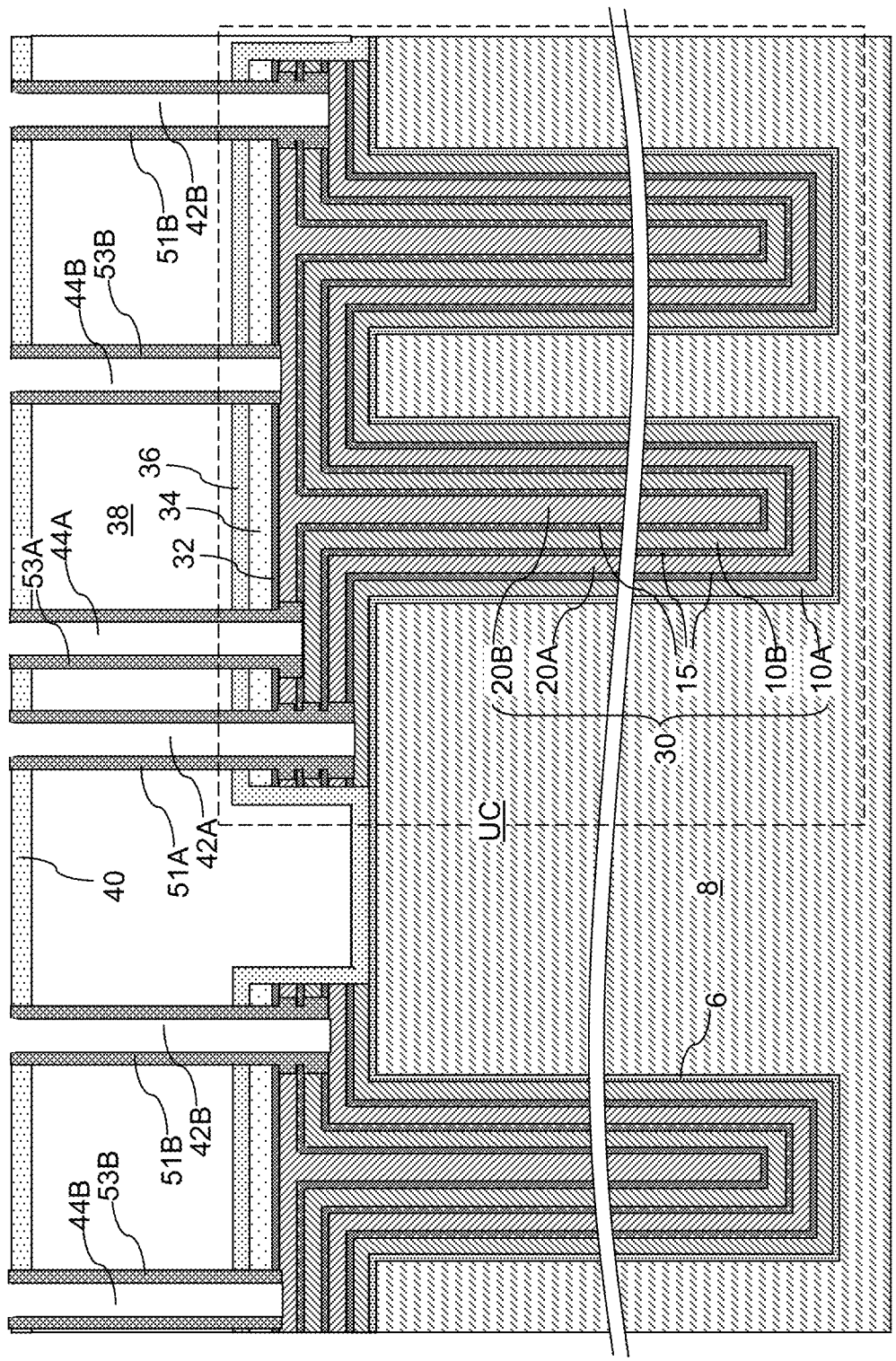
FIG. 11B is a vertical cross-sectional view of an alternative embodiment of the exemplary structure of FIG. 11A.

Referring to FIG. 11B, an alternative embodiment of the exemplary structure may be derived from the exemplary structure illustrated in FIG. 9 by anisotropically etching a node dielectric layer 15 at the bottom of each of the contact via cavities (41A, 41B, 43A, 43B). A top surface of a metallic electrode plate (10A, 10B, 20A, 20B) is physically exposed at the bottom of each contact via cavity (41A, 41B, 43A, 43B). In the alternative embodiment illustrated in FIG. 11B, the processing steps of FIG. 10 are omitted. Subsequently, the processing steps of FIG. 11A can be subsequently performed to form dielectric contact via liners (51A, 51B, 53A, 53B). Specifically, a continuous dielectric liner layer may be conformally deposited on sidewalls of the contact via cavities (41A, 41B, 43A, 43B), on physically exposed portions of top surfaces of the metallic electrode plates (10A, 10B, 20A, 20B), and over the contact-level dielectric layer 38, and horizontal portions of the continuous dielectric liner layer can be removed by performing an anisotropic etch process. Remaining portions of the continuous dielectric liner layer comprise the dielectric contact via liners (51A, 51B, 53A, 53B). In one embodiment, the first dielectric contact via liners 51A, the second dielectric contact via liners 51B, and the third dielectric contact via liners 53A can include a respective set of at least one annular dielectric rim that laterally protrudes outward toward laterally recessed surfaces of the metallic electrode plates (10A, 10B, 20A, 20B). The resulting first dielectric contact via liners 51A, second dielectric contact via liners 51B, third dielectric contact via liners 53A and fourth dielectric contact via liners 53B may provided improved performance to reduce leakage current.

Figure 12:
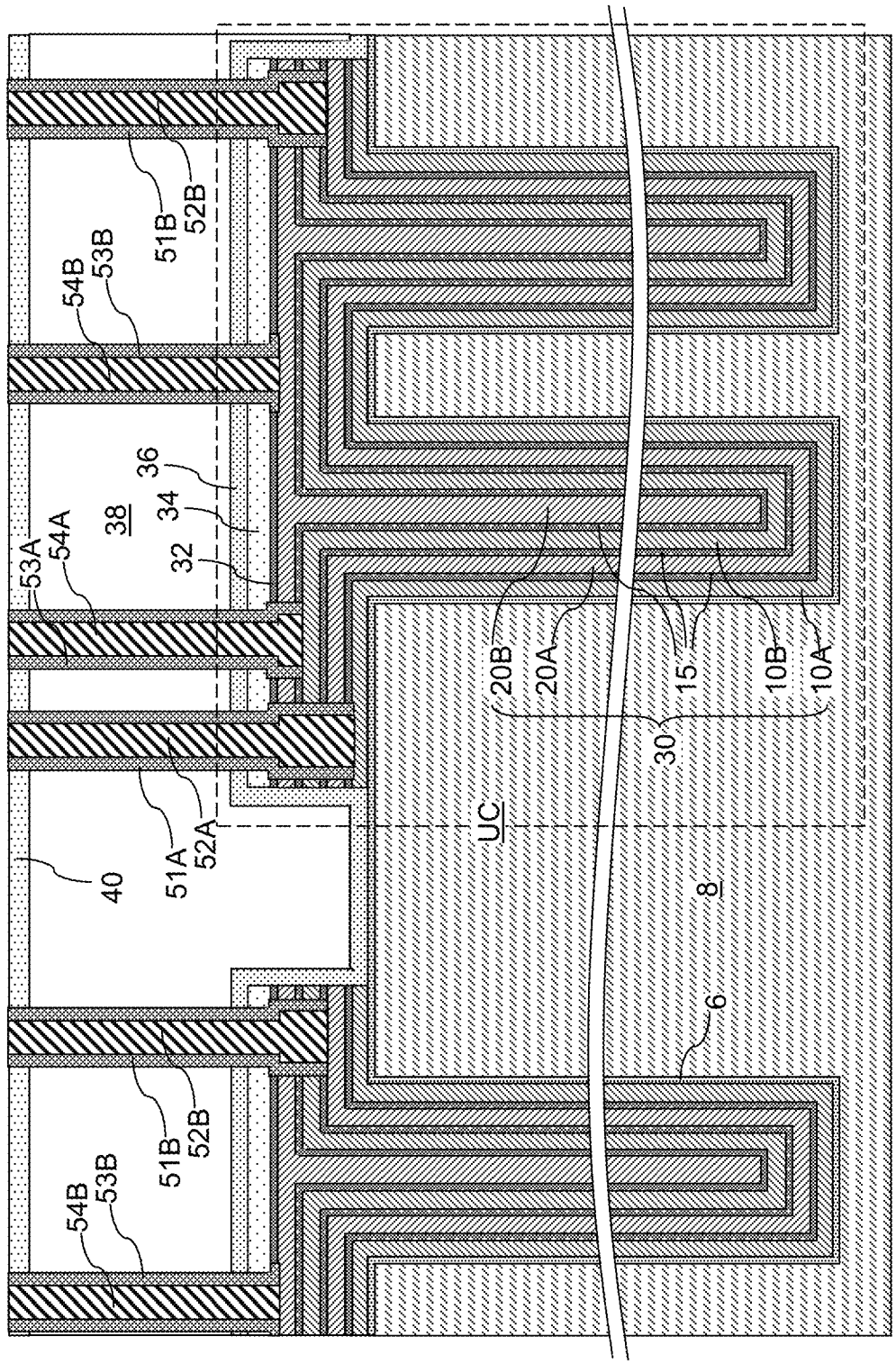
FIG. 12 is a vertical cross-sectional view of the exemplary structure after formation of plate contact via structures according to an embodiment of the present disclosure.

Referring to FIG. 12, at least one conductive material may be deposited in the unfilled volumes of the contact via cavities (41A, 41B, 43A, 43B), i.e., within the voids (42A, 42B, 44A, 44B) that are laterally surrounded by a respective one of the dielectric contact via liners (51A, 51B, 53A, 53B). The at least one conductive material can include, for example, a combination of a metallic nitride liner material and a metallic fill material. For example, a metallic nitride liner layer including a metallic nitride material (such as TiN, TaN, and/or WN) may be deposited in the voids (42A, 42B, 44A, 44B), and a metallic fill material (such as W, Cu, Mo, Co, Ru, or an alloy or a combination thereof) can fill remaining volumes of the voids (42A, 42B, 44A, 44B). Other suitable materials within the contemplated scope of disclosure may also be used. Excess portions of the at least one metallic material may be removed from above the horizontal plane including the top surface of the dielectric capping layer 40 by a planarization process, which may use a recess etch and/or chemical mechanical planarization.

Each remaining portion of the at least one conductive material that fills a respective void (42A, 42B, 44A, 44B) constitutes a plate contact via structures (52A, 52B, 54A, 54B). A combination of a dielectric contact via liner (51A, 51B, 53A, 53B) and a plate contact via structure (52A, 52B, 54A, 54B) may be formed within each of the contact via cavities (41A, 41B, 43A, 43B). Specifically, a combination of a first dielectric contact via liner 51A and a first plate contact via structure 52A may be formed within each first contact via cavity 41A. A combination of a second dielectric contact via liner 51B and a second plate contact via structure 52B may be formed within each second contact via cavity 41B. A combination of a third dielectric contact via liner 53A and a third plate contact via structure 54A may be formed within each third contact via cavity 43A. A combination of a fourth dielectric contact via liner 53B and a fourth plate contact via structure 54B may be formed within each fourth contact via cavity 43B. Each first plate contact via structure 52A contacts a top surface of a first metallic electrode plate 10A. Each second plate contact via structure 52B contacts a top surface of a second metallic electrode plate 10B. Each third plate contact via structure 54A contacts a top surface of a third metallic electrode plate 20A. Each fourth plate contact via structure 54B contacts a top surface of a fourth metallic electrode plate 20B.

In one embodiment, each of the first plate contact via structures 52A, each of the second plate contact via structures 52B, and each of the third plate contact via structures 54A may have a bulging portion that underlies a columnar portion having a lesser maximum lateral dimension than the bulging portion. Each columnar portion of first plate contact via structures 52A, each of the second plate contact via structures 52B, and each of the third plate contact via structures 54A can have a respective straight sidewall, which may be a vertical sidewall or a tapered sidewall. Each bulging portion of the first plate contact via structures 52A, the second plate contact via structures 52B, and the third plate contact via structures 54A contacts a respective underlying one of the metallic electrode plates (10A, 10B, 20A, 20B), which may be a first metallic electrode plate 10A, a second metallic electrode plate 10B, or a third metallic electrode plate 20A.

Figure 13A:
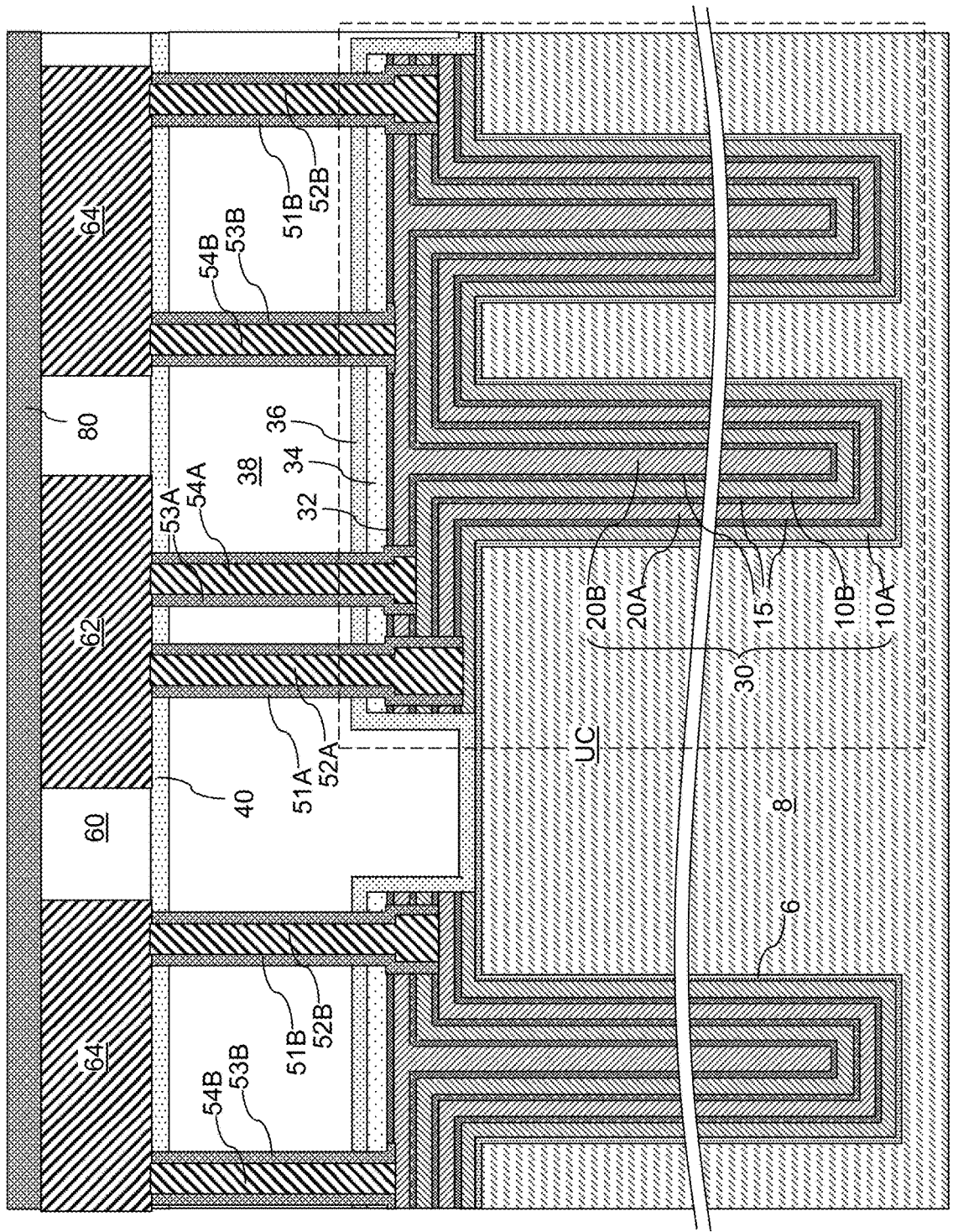
FIG. 13A is a vertical cross-sectional view of the exemplary structure after formation of metal interconnect structures according to an embodiment of the present disclosure.
Figure 13B:
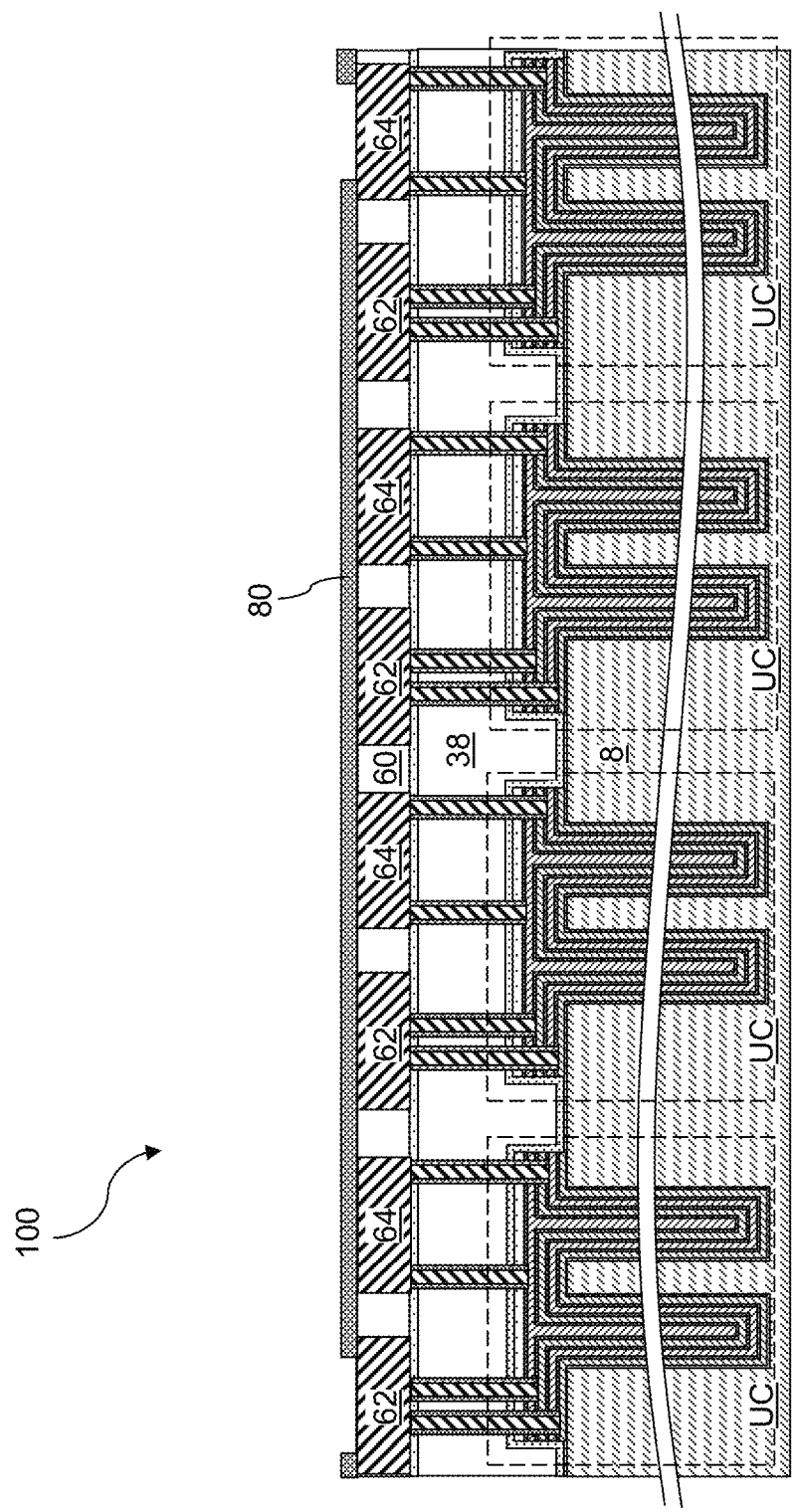
FIG. 13B is a zoom-out vertical cross-sectional view of the exemplary structure of FIG. 13A.

Referring to FIGS. 13A and 13B, a line-level dielectric layer 60 may be formed over the dielectric capping layer 40. The line-level dielectric layer 60 includes a dielectric material such as undoped silicate glass or a doped silicate glass. The thickness of the line-level dielectric layer 60 can be in a range from 100 nm to 400 nm, although lesser and greater thicknesses can also be used.

Metal interconnect structures (62, 64) may be formed in the line-level dielectric layer 60, for example, by patterning line trenches through the line-level dielectric layer 60 and by filling the line trenches with at least one metallic material such as a combination of a metallic nitride liner (such as TiN) and a metallic fill material (such as Cu). Other suitable materials within the contemplated scope of disclosure may also be used. Excess portions of the at least one metallic material may be removed from above the horizontal plane including the top surface of the line-level dielectric layer 60 by a planarization process such as a chemical mechanical planarization process. Remaining portions of the at least one metallic material that fills a respective line trench constitute metal lines (62, 64). The metal lines (62, 64) include at least one first metal line 62 that contacts a respective subset, or all, of the first plate contact via structures 52A and the third plate contact via structures 54A, and at least one second metal line 64 that contacts a respective subset, or all, of the second plate contact via structures 52B and the fourth plate contact via structures 54B. The at least one first metal line 62 may be formed as multiple metal lines, or may be formed as a single continuous metal line that includes multiple fingers that extend over, and contact, each of the first plate contact via structures 52A and the third plate contact via structures 54A. Likewise, the at least one second metal line 64 may be formed as multiple metal lines, or may be formed as a single continuous metal line that includes multiple fingers that extend over, and contact, each of the second plate contact via structures 52B and the fourth plate contact via structures 54B. Each of the first plate contact via structures 52A and the third plate contact via structures 54A can be contacted by a respective first metal line 62, and each of the second plate contact via structures 52A and the fourth plate contact via structures 54B can be contacted by a respective second metal line 64. Generally, metal interconnect structures formed in at least one dielectric material layer may be formed over the plate contact via structures (52A, 52B, 54A, 54B).

In one embodiment, each first metal line 62 and each second metal line 64 may include a pad region having a sufficient area for forming a bonding structure (such as a solder ball) thereupon. A passivation dielectric layer 80 may be formed over the line-level dielectric layer 60. The passivation dielectric layer 80 may include a dielectric diffusion blocking material such as silicon nitride. The thickness of the passivation dielectric layer 80 may be in a range from 50 nm to 200 nm, although lesser and greater thicknesses can also be used. The passivation dielectric layer 80 may include an opening in each area in which a bonding structure (such as a solder ball) is to be bonded to a physically exposed surface of a first metal line 62 or a second metal line 64.

The exemplary structure may be formed on a semiconductor substrate such as a semiconductor wafer, and may be subsequently diced into a semiconductor die 100. Each semiconductor die 100 can include at least one deep trench capacitor. Each deep trench capacitor may be formed over multiple unit capacitor regions UC or may be formed over a single unit capacitor region UC. The semiconductor die 100 can be provided as a stand-alone capacitor die, or can be provided as an integrated semiconductor die including deep trench capacitors and other semiconductor devices such as complementary metal-oxide-semiconductor (CMOS) transistors.

Figure 13C:
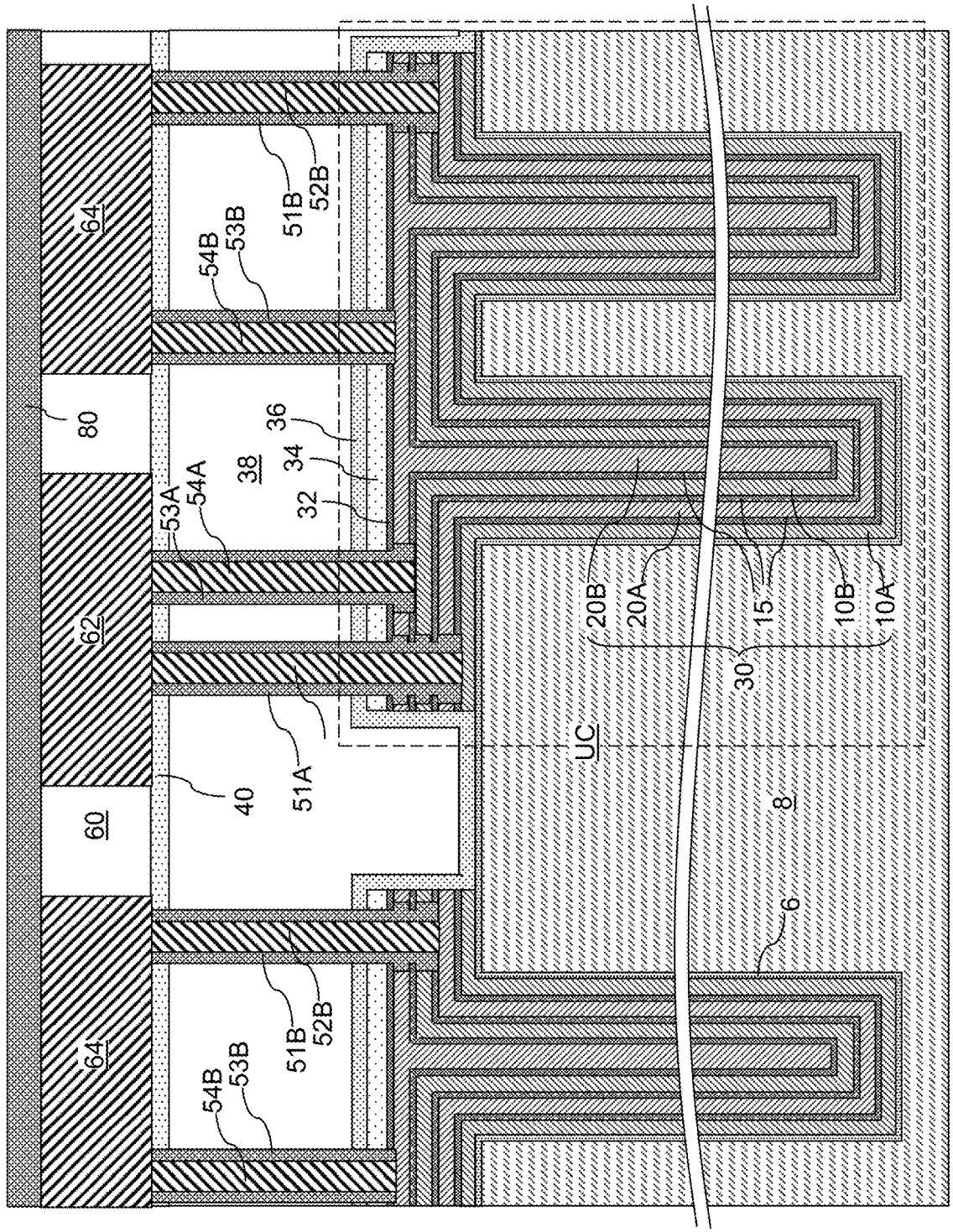
FIG. 13C is a vertical cross-sectional view of an alternative embodiment of the exemplary structure of FIG. 13A.

Referring to FIG. 13C, an alternative embodiment of the exemplary structure at the processing steps of FIGS. 13A and 13B is illustrated. The alternative embodiment of the exemplary structure can be derived from the structure of FIG. 11B by subsequently performing the processing steps of FIGS. 12, 13A, and 13B.

Figure 14:
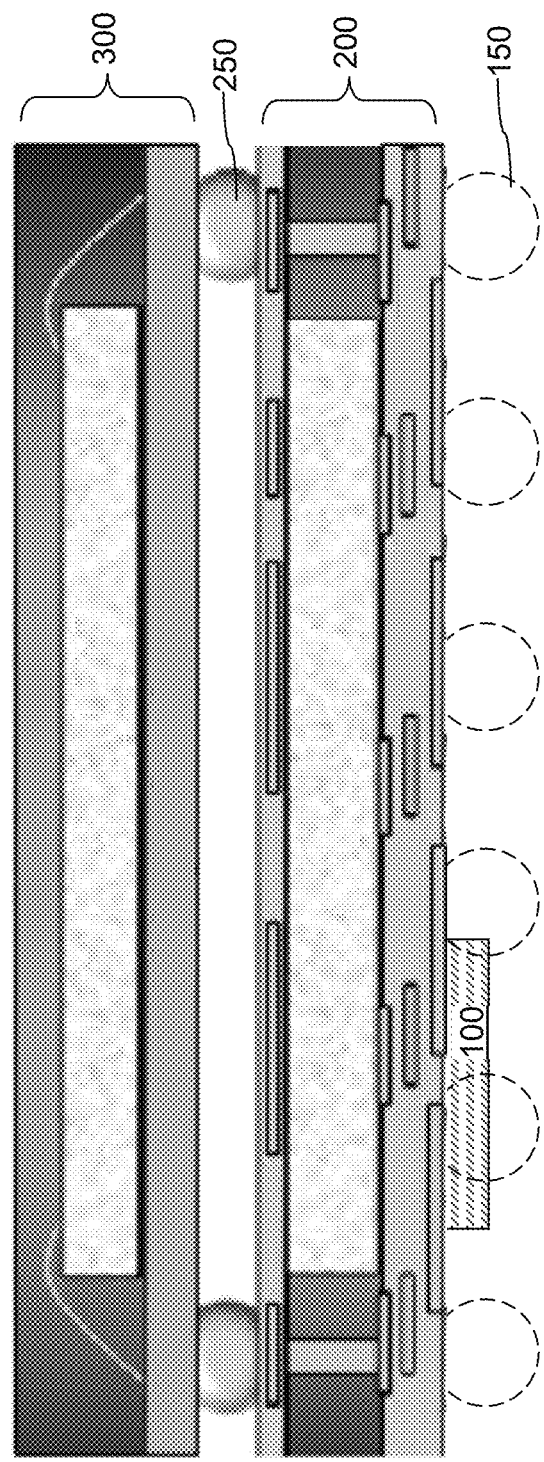
FIG. 14 is a vertical cross-sectional view of an exemplary chip assembly incorporating a semiconductor die containing deep trench capacitors according to an embodiment of the present disclosure.

Referring to FIG. 14, a non-limiting exemplary application of the semiconductor die 100 of FIG. 13B is illustrated. The semiconductor die 100 may be attached to the land side of a system-on-a-chip (SoC) die 200, which is bonded to an integrated fan-out package on package (InFO PoP) die 300 via an array of solder balls 250. The SoC die 200 may be bonded to another module, such as a printed circuit board (PCB) via another array of solder balls 150. The deep trench capacitor(s) in the semiconductor die 100 may stabilize the power supply system in the SoC die 200.

Referring to FIGS. 1-14 and according to an aspect of the present disclosure, a deep trench capacitor may be provided. The deep trench capacitor may include at least one deep trench 9 extending downward from a top surface of a substrate 8, and a layer stack 30 including at least three metallic electrode plates (10A, 10B, 20A, 20B) interlaced with at least two node dielectric layers 15. Each layer within the layer stack 30 may include a respective vertically-extending portion located inside each of the at least one deep trench 9 and a respective horizontally-extending portion located above the top surface of the substrate 8. A primary electrode assembly (10A, 20A, 52A, 54A, 62) includes at least two primary metallic electrode plates (10A, 20A) selected from the at least three metallic electrode plates (10A, 10B, 20A, 20B). A complementary electrode assembly (10B, 20B, 52B, 54B, 64) includes at least one complementary metallic electrode plate (10B, 20B) selected from the at least three metallic electrode plates (10A, 10B, 20A, 20B). Each layer within the layer stack 30 has a respective sidewall (which is in contact with an etch stop dielectric layer 36) contained within a vertical plane that includes a segment of an outer periphery of the layer stack 30.

The various embodiments disclosed herein provide structures and methods to form a deep trench capacitor having reliable electrical contact structures with reduced electrical opens and electrical shorts. The methods for forming the deep trench capacitors disclosed herein form electrical contacts to metallic electrode plates without electrical opens or electrical shorts. By providing reliable electrical contact between the plate contact via structures and the metallic electrode plates, the various embodiments disclosed herein may provide higher yield and increased durability of the deep trench capacitor during fabrication of the device.

In one embodiment, the at least two primary metallic electrode plates (10A, 10B) are electrically connected to one another through a first subset (52A, 54A) of the plate contact via structures (52A, 52B, 54A, 54B) and a first subset of the metal interconnect structures (62, 64) such as at least one first metal line 62. The at least one complementary metallic electrode plate (10B, 20B) can include at least two complementary metallic electrode plates (10B, 20B) that are electrically connected to one another through a second subset (52B, 54B) of the plate contact via structures (52A, 52B, 54A, 54B) and a second subset of the metal interconnect structures (62, 64) such as at least one second metal line 64.

In one embodiment, plate contact via structures (52A, 52B, 54A, 54B) can contact a top surface of a respective one of the at least three metallic electrode plates (10A, 10B, 20A, 20B). In one embodiment, each interface between the plate contact via structures (52A, 52B, 54A, 54B) and the at least three metallic electrode plates (10A, 10B, 20A, 20B) can be located within a horizontal plane including a top surface of a respective one of the at least three metallic electrode plates (10A, 10B, 20A, 20B). In one embodiment, each of the plate contact via structures (52A, 52B, 54A, 54B) can be laterally surrounded by a respective dielectric contact via liner (51A, 51B, 53A, 53B) having a uniform lateral thickness.

In one embodiment, at least two of the plate contact via structures (52A, 52B, 54A, 54B) (such as each of the first plate contact via structures 52A, each of the second plate contact via structures 52B, and each of the third plate contact via structures 54A) can have a bulging portion that contacts a respective one of the at least three metallic electrode plates (10A, 10B, 20A, 20B) and underlies a columnar portion having a lesser maximum lateral dimension than the bulging portion.

According to another aspect of the present disclosure, a semiconductor structure including at least one deep trench capacitor located on a substrate 8 is provided. Each of the at least one deep trench capacitor includes a deep trench 9 extending downward from a top surface of the substrate 8, a layer stack 30 including at least three metallic electrode plates (10A, 10B, 20A, 20B) interlaced with at least two node dielectric layers 15, and plate contact via structures (52A, 52B, 54A, 54B) contacting a top surface of a respective one of the at least three metallic electrode plates (10A, 10B, 20A, 20B). Each layer within the layer stack 30 includes a respective vertically-extending portion located inside the deep trench 9 and a respective horizontally-extending portion located above the top surface of the substrate 8. Each interface between the plate contact via structures (52A, 52B, 54A, 54B) and the at least three metallic electrode plates (10A, 10B, 20A, 20B). is located within a horizontal plane including a top surface of a respective one of the at least three metallic electrode plates (10A, 10B, 20A, 20B). Each of the plate contact via structures (52A, 52B, 54A, 54B) is laterally surrounded by a respective dielectric contact via liner (51A, 51B, 53A, 53B) having a uniform lateral thickness.

In one embodiment, each of the at least one deep trench capacitor can include a primary electrode assembly (10A, 20A, 52A, 54A, 62) that comprises at least two primary metallic electrode plates (10A, 20A) selected from the at least three metallic electrode plates (10A, 10B, 20A, 20B), and a complementary electrode assembly (10B, 20B, 52B, 54B, 64) that comprises at least one complementary metallic electrode plate (10B, 20B) selected from the at least three metallic electrode plates (10A, 10B, 20A, 20B).

In one embodiment, the at least one deep trench comprises a plurality of deep trench capacitors. The primary electrode assemblies (10A, 20A, 52A, 54A, 62) of the plurality of deep trench capacitors are electrically connected to one another by a first subset (52A, 54A) of the plate contact via structures (52A, 52B, 54A, 54B) and a first subset (such as the first metal lines 62) of metal interconnect structures (62, 64). The complementary electrode assemblies (10B, 20B, 52B, 54B, 64) of the plurality of deep trench capacitors are electrically connected to one another by a second subset (52B, 54B) of the plate contact via structures (52A, 52B, 54A, 54B) and a second subset (such as the second metal lines 64) of the metal interconnect structures (62, 64).

Referring to FIG. 15, a general method of forming a memory device is provided according to an embodiment of the present disclosure. Referring to step 1510, at least one deep trench 9 vertically extending into a substrate 8 can be formed. Referring to step 1520, a layer stack 30 including at least three metallic electrode plates (10A, 10B, 20A, 20B) interlaced with at least two node dielectric layers 15 can be formed in, and over, the at least one deep trench 9. Referring to step 1530, a contact-level dielectric material layer 38 can be formed over the layer stack 30. Referring to step 1540, contact via cavities (41A, 41B, 43A, 43B) can be formed through the contact-level dielectric material layer 38 such that each of the contact via cavities (41A, 41B, 43A, 43B) has a bottom surface located above a topmost layer (such as the fourth metallic electrode plate 20B) within the layer stack 30. Referring to step 1550, a depth of a respective subset of the contact via cavities (41A, 41B, 43A, 43B) can be selectively increased (without increasing the depths of other contact via cavities) by performing at least twice a combination of processing steps that includes an etch mask formation process and an etch process. Referring to step 1560, a combination of a dielectric contact via liner (51A, 51B, 53A, 53B) and a plate contact via structure (52A, 52B, 54A, 54B) can be formed within each of the contact via cavities (41A, 41B, 43A, 43B).

Generally, the bottom surface of each plate contact via structure (52A, 52B, 54A, 54B) can be self-aligned to the horizontal plane that includes an interface between an underlying metallic electrode plate (10A, 10B, 20A, 20B) and an overlying one of the node dielectric layers 15 and the node dielectric material layer 32. Thus, the etch process window for forming the contact via cavities (41A, 41B, 43A, 43B) can be wide and stable. Further, each plate contact via structure (52A, 52B, 54A, 54B) that extends through any metallic electrode plate (10A, 10B, 20A, 20B) is electrically isolated from such a metallic electrode plate (10A, 10B, 20A, 20B) by a respective dielectric contact via line (51A, 51B, 53A, 53B) to prevent lateral electrical shorts. The structures and the methods according to various embodiments of the present disclosure can provide a reliable deep trench capacitor with high yield during manufacturing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deep trench capacitor comprising:
    at least one deep trench extending downward from a top surface of a substrate;
    a layer stack including at least three metallic electrode plates interlaced with at least two node dielectric layers; and
    plate contact via structures contacting a top surface of a respective one of the at least three metallic electrode plates, wherein:
        each layer within the layer stack comprises a respective vertically-extending portion located inside each of the at least one deep trench and a respective horizontally-extending portion located above the top surface of the substrate;
        a primary electrode assembly comprises at least two primary metallic electrode plates selected from the at least three metallic electrode plates;
        a complementary electrode assembly comprises at least one complementary metallic electrode plate selected from the at least three metallic electrode plates;
        each layer within the layer stack has a respective sidewall contained within a vertical plane that includes a segment of an outer periphery of the layer stack; and
        at least one of the plate contact via structures comprises a respective bulging portion that contacts a respective one of the at least three metallic electrode plates and underlies a respective columnar portion having a lesser maximum lateral dimension than the respective bulging portion.

2. The deep trench capacitor of claim 1, wherein each outer sidewall of the horizontally-extending portion of each layer within the layer stack is located within a respective vertical plane within a set of at least one vertical plane that contains an entirety of the outer periphery of the layer stack.

3. The deep trench capacitor of claim 1, further comprising an etch stop dielectric layer that overlies the layer stack, wherein an entire periphery of a horizontal bottom surface of the etch stop dielectric layer adjoins an entire upper periphery of a vertically-extending portion of the etch stop layer that laterally surrounds, and contacts, each outer sidewall of each layer within layer stack.

4. The deep trench capacitor of claim 3, wherein all interfaces between the vertically-extending portion of the etch stop dielectric layer and the outer sidewalls of each layer within layer stack are vertical.

5. The deep trench capacitor of claim 1, wherein each interface between the plate contact via structures and the at least three metallic electrode plates is located within a horizontal plane including a top surface of a respective one of the at least three metallic electrode plates.

6. The deep trench capacitor of claim 1, wherein each of the plate contact via structures is laterally surrounded by a respective dielectric contact via liner having a uniform lateral thickness.

7. The deep trench capacitor of claim 6, wherein:
a first dielectric contact via liner selected from the dielectric contact via liners contacts sidewalls of horizontally-extending portions of at least two metallic electrode plates selected from the at least three metallic electrode plates; and
a second dielectric contact via liner selected from the dielectric contact via liners contacts sidewalls of a horizontally-extending portion of at least one metallic electrode plate selected from the at least three metallic electrode plates.

8. The deep trench capacitor of claim 1, wherein the at least one of the plate contact via structures comprises two or more plate contact via structures.

9. The deep trench capacitor of claim 1, further comprising metal interconnect structures formed in at least one dielectric material layer that overlies plate contact via structures, wherein:
the at least two primary metallic electrode plates are electrically connected to one another through a first subset of the plate contact via structures and a first subset of the metal interconnect structures; and
the at least one complementary metallic electrode plate comprises at least two complementary metallic electrode plates that are electrically connected to one another through a second subset of the plate contact via structures and a second subset of the metal interconnect structures.

10. The deep trench capacitor of claim 1, wherein:
each of the at least three metallic electrode plates comprises a conductive metallic nitride material; and
each of the at least two node dielectric layers comprises a dielectric metal oxide material having a dielectric constant greater than 7.9.

11. A semiconductor structure comprising at least one deep trench capacitor located on a substrate, wherein each of the at least one deep trench capacitor comprises:
a deep trench extending downward from a top surface of the substrate;
a layer stack including at least three metallic electrode plates interlaced with at least two node dielectric layers; and
plate contact via structures contacting a top surface of a respective one of the at least three metallic electrode plates, wherein:
each layer within the layer stack comprises a respective vertically-extending portion located inside the deep trench and a respective horizontally-extending portion located above the top surface of the substrate;
each interface between the plate contact via structures and the at least three metallic electrode plates is located within a horizontal plane including a top surface of a respective one of the at least three metallic electrode plates;
each of the plate contact via structures is laterally surrounded by a respective dielectric contact via liner having a uniform lateral thickness; and
at least one of the plate contact via structures comprises a respective bulging portion that contacts a respective metallic electrode among the at least three metallic electrode plates and underlies a respective columnar portion having a lesser maximum lateral dimension than the respective bulging portion.

12. The semiconductor structure of claim 11, wherein each of the at least one deep trench capacitor comprises:
a primary electrode assembly that comprises at least two primary metallic electrode plates selected from the at least three metallic electrode plates; and
a complementary electrode assembly that comprises at least one complementary metallic electrode plate selected from the at least three metallic electrode plates.

13. The semiconductor structure of claim 12, wherein:
the at least one deep trench comprises a plurality of deep trench capacitors;
the primary electrode assemblies of the plurality of deep trench capacitors are electrically connected to one another by a first subset of the plate contact via structures and a first subset of metal interconnect structures; and
the complementary electrode assemblies of the plurality of deep trench capacitors are electrically connected to one another by a second subset of the plate contact via structures and a second subset of the metal interconnect structures.

14. A deep trench capacitor comprising:
at least one deep trench extending downward from a top surface of a substrate;
a layer stack including at least three metallic electrode plates interlaced with at least two node dielectric layers; and
plate contact via structures contacting a top surface of a respective one of the at least three metallic electrode plates,
wherein:
each of the plate contact via structures is laterally surrounded by a respective dielectric contact via liner having a uniform lateral thickness;
each layer within the layer stack comprises a respective vertically-extending portion located inside each of the at least one deep trench and a respective horizontally-extending portion located above the top surface of the substrate;
a primary electrode assembly comprises at least two primary metallic electrode plates selected from the at least three metallic electrode plates;
a complementary electrode assembly comprises at least one complementary metallic electrode plate selected from the at least three metallic electrode plates; and
at least one of the plate contact via structures comprises a respective bulging portion that contacts a respective metallic electrode among the at least three metallic electrode plates and underlies a respective columnar portion having a lesser maximum lateral dimension than the respective bulging portion.

15. The deep trench capacitor of claim 14, further comprising:
a contact-level dielectric layer overlying the horizontally-extending portions of the layer stack; and
dielectric contact via liners laterally surrounding a respective one of the plate contact via structures and laterally surrounded by the contact-level dielectric layer.

16. The deep trench capacitor of claim 15, wherein:
one of the dielectric contact via liners comprises a respective upper portion vertically extending through the contact-level dielectric layer and a lower portion located under a topmost surface of the layer stack; and
the lower portion has a greater lateral extent than the upper portion.

17. The deep trench capacitor of claim 14, wherein each interface between the plate contact via structures and the at least three metallic electrode plates is located within a respective horizontal plane including a top surface of a respective one of the at least three metallic electrode plates.

18. The deep trench capacitor of claim 14, wherein the horizontally-extending portion of each layer within the layer stack has a respective sidewall that overlies the top surface of the substrate and is contained within a vertical plane that includes a segment of an outer periphery of a top surface of the layer stack.

19. The deep trench capacitor of claim 18, wherein each outer sidewall of the horizontally-extending portion of each layer within the layer stack is located within a respective vertical plane within a set of at least one vertical plane that contains an entirety of the outer periphery of the layer stack.

20. The deep trench capacitor of claim 14, further comprising metal interconnect structures located in at least one dielectric material layer that overlies plate contact via structures, wherein:
- the at least two primary metallic electrode plates are electrically connected to one another through a first subset of the plate contact via structures and a first subset of the metal interconnect structures; and
- the at least one complementary metallic electrode plate comprises at least two complementary metallic electrode plates that are electrically connected to one another through a second subset of the plate contact via structures and a second subset of the metal interconnect structures.

* * * * *